US010558078B2

United States Patent
Baek et al.

(10) Patent No.: US 10,558,078 B2
(45) Date of Patent: Feb. 11, 2020

(54) POLARIZING LAYER AND DISPLAY DEVICE HAVING THE SAME

(71) Applicant: SAMSUNG DISPLAY CO., LTD., Yongin-si, Gyeonggi-do (KR)

(72) Inventors: Seung In Baek, Yongin-si (KR); Hyun Eok Shin, Yongin-si (KR); Su Jin Choi, Yongin-si (KR); Sang Gab Kim, Yongin-si (KR); Ji Hun Kim, Yongin-si (KR); Hyeon Hwan Kim, Yongin-si (KR); Jung Gun Nam, Yongin-si (KR); Young Eun Park, Yongin-si (KR); Joon Yong Park, Yongin-si (KR); Jin Ho Park, Yongin-si (KR); Gyung Min Baek, Yongin-si (KR); Yun Jong Yeo, Yongin-si (KR); Gug Rae Jo, Yongin-si (KR); Hyun Ji Ha, Yongin-si (KR); Youn Ho Han, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/870,398

(22) Filed: Jan. 12, 2018

(65) Prior Publication Data

US 2018/0364521 A1 Dec. 20, 2018

(30) Foreign Application Priority Data

Jun. 14, 2017 (KR) .................. 10-2017-0074992

(51) Int. Cl.
*G02F 1/1335* (2006.01)
*G02F 1/1368* (2006.01)

(52) U.S. Cl.
CPC .. *G02F 1/133528* (2013.01); *G02F 1/133502* (2013.01); *G02F 1/1368* (2013.01);
(Continued)

(58) Field of Classification Search
CPC ............. G02F 1/133345; G02F 1/1335; G02F 1/1343; G02F 1/136; G02F 1/1362;
(Continued)

(56) References Cited

U.S. PATENT DOCUMENTS 9,064,763 B2 6/2015 Ozawa et al.
9,568,767 B2 2/2017 Nam et al.
(Continued)

FOREIGN PATENT DOCUMENTS

KR 10-2013-0101972 9/2013
KR 10-2015-0005086 1/2015
(Continued)

OTHER PUBLICATIONS www.kayelaby.npl.co.uk_general_physicsl_2.5.9 Light reflection, as printed on Sep. 8, 2017.

*Primary Examiner* — Thoi V Duong
(74) *Attorney, Agent, or Firm* — F. Chau & Associates, LLC

(57) ABSTRACT

A polarizing layer includes a substrate and a plurality of parallel wires disposed on the substrate. Each of the plurality of wires includes a base layer disposed on the substrate and an anti-reflective layer disposed on the base layer. The base layer includes aluminum or an aluminum alloy. The anti-reflective layer has a thickness within a range of 12 nm to 40 nm.

17 Claims, 26 Drawing Sheets

(52) U.S. Cl.
CPC .............. *G02F 1/133514* (2013.01); *G02F 2001/133548* (2013.01); *G02F 2201/38* (2013.01); *G02F 2203/09* (2013.01)

(58) Field of Classification Search
CPC ......... G02F 1/133528; G02F 1/133502; G02F 1/133514; G02F 1/1368; G02F 2001/133357; G02F 2001/133545; G02F 2201/38; G02B 5/3058; G02B 5/30; G02B 1/11
See application file for complete search history.

(56) References Cited

U.S. PATENT DOCUMENTS

| | | | |
|---|---|---|---|
| 9,651,727 B2 | 5/2017 | Lee et al. | |
| 9,726,897 B2 | 8/2017 | Huang et al. | |
| 2002/0021393 A1* | 2/2002 | Ochiai | G02B 1/111 349/137 |
| 2006/0269724 A1* | 11/2006 | Ohashi | G02B 1/111 428/143 |
| 2012/0183739 A1* | 7/2012 | Kim | G02B 5/3058 428/167 |
| 2014/0133027 A1* | 5/2014 | Jang | G02B 5/3058 359/485.03 |
| 2016/0161654 A1 | 6/2016 | Yeo et al. | |

FOREIGN PATENT DOCUMENTS

| | | |
|---|---|---|
| KR | 10-2016-0069022 | 6/2016 |
| KR | 10-2017-0010189 | 1/2017 |
| KR | 10-2017-0013216 | 2/2017 |

\* cited by examiner

FIG. 12
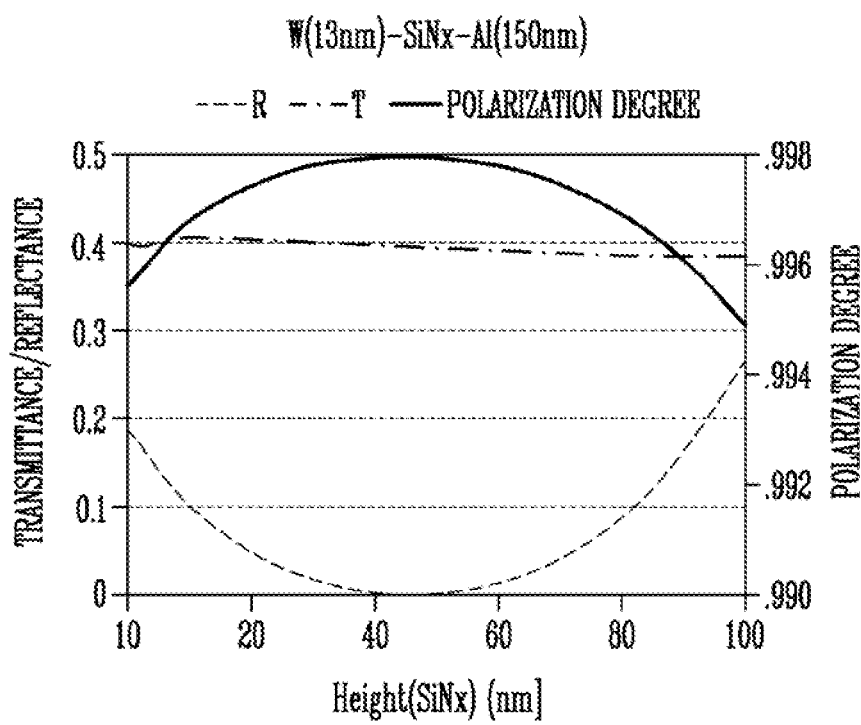
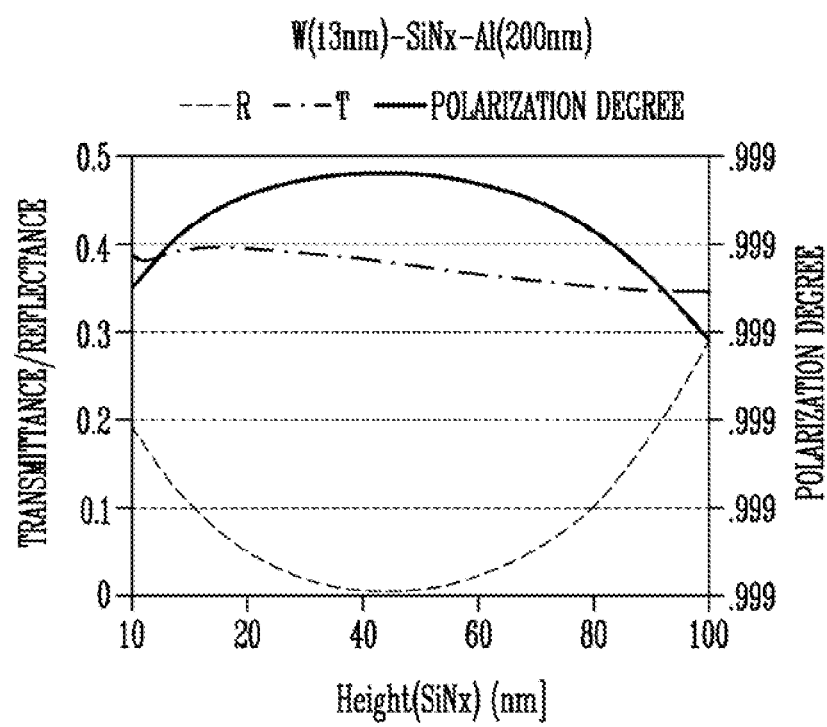

FIG. 13
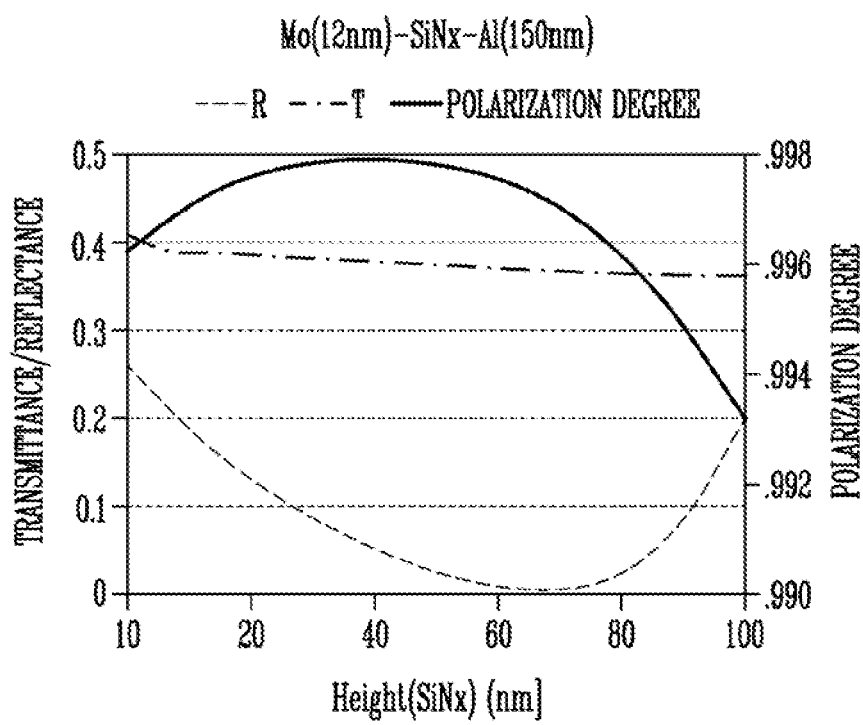
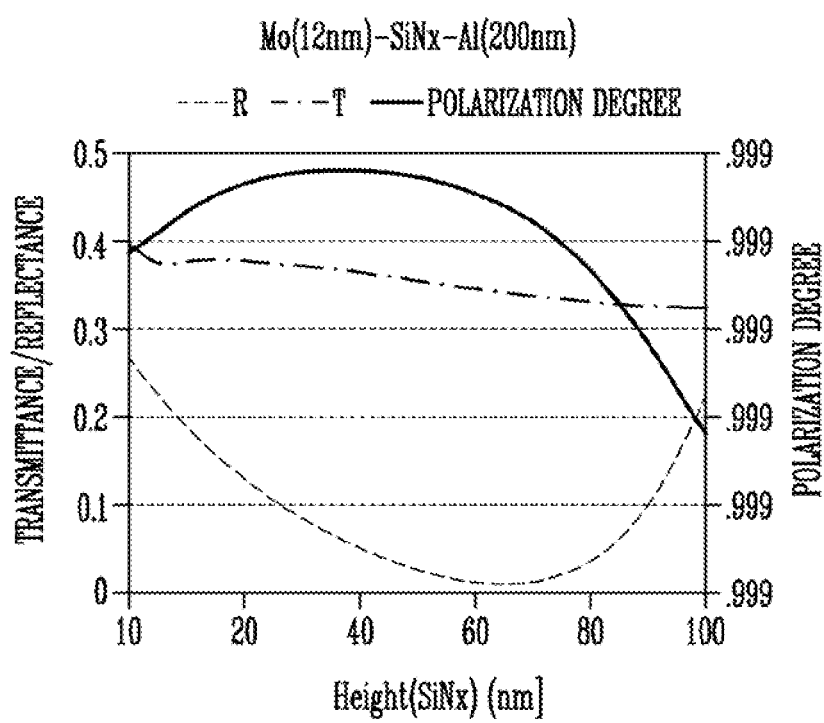

FIG. 14
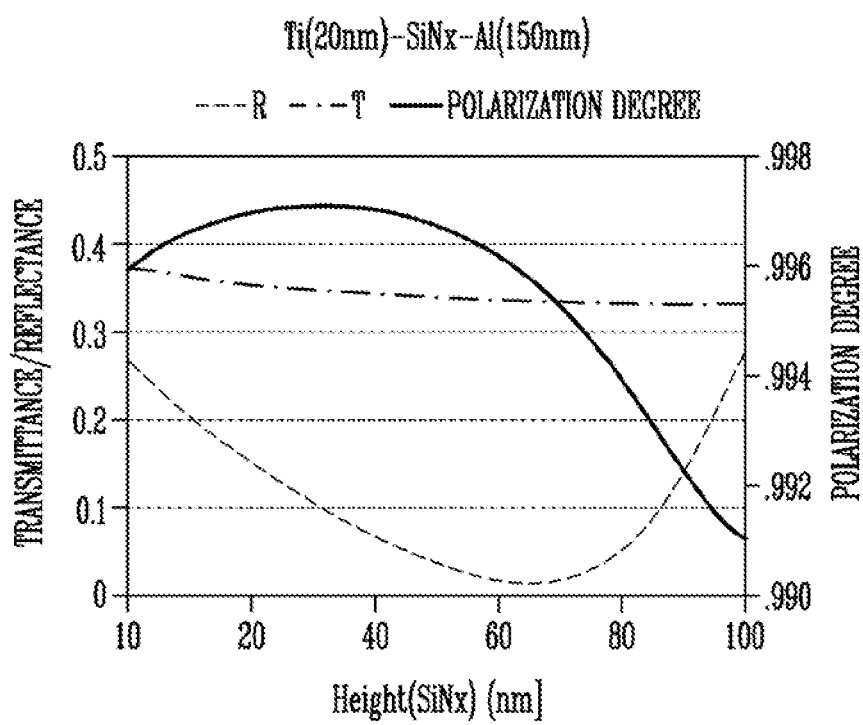
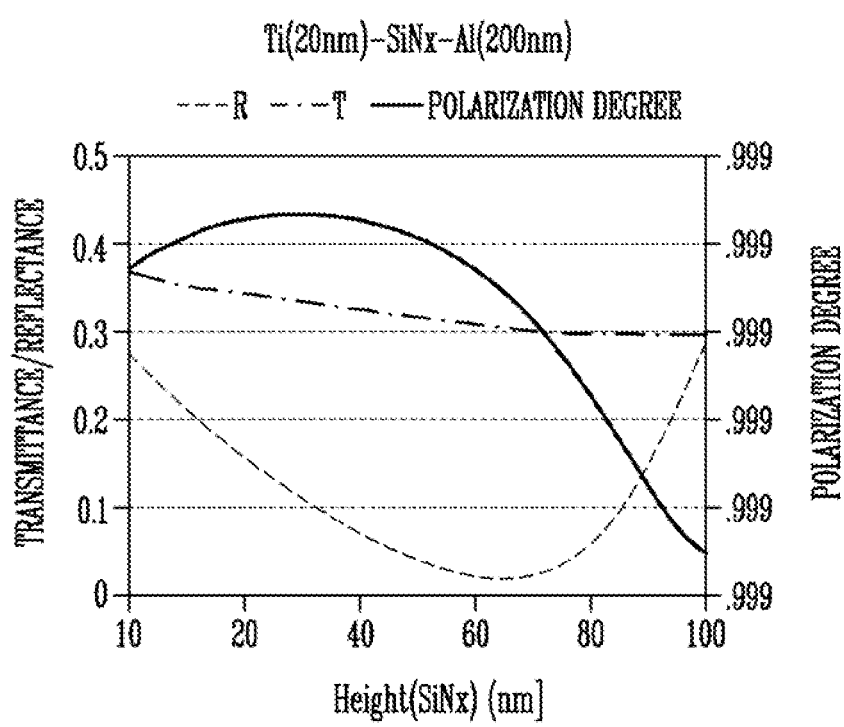

FIG. 15
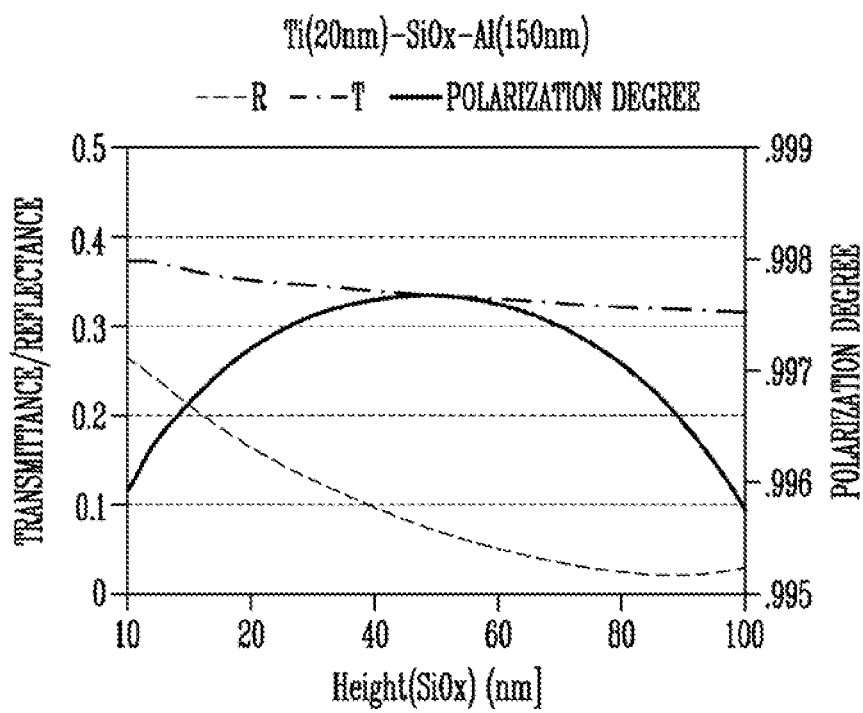
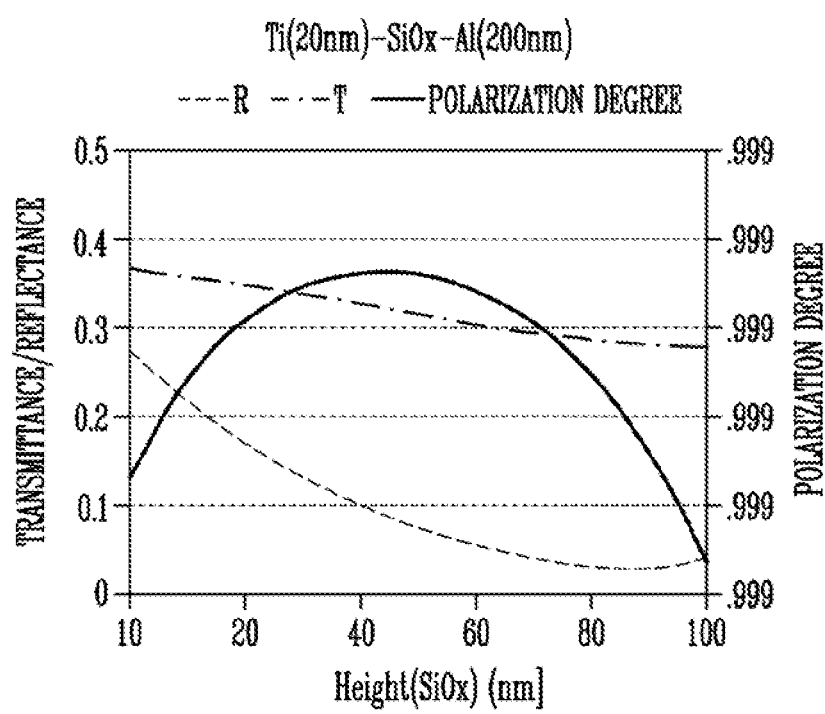

FIG. 16
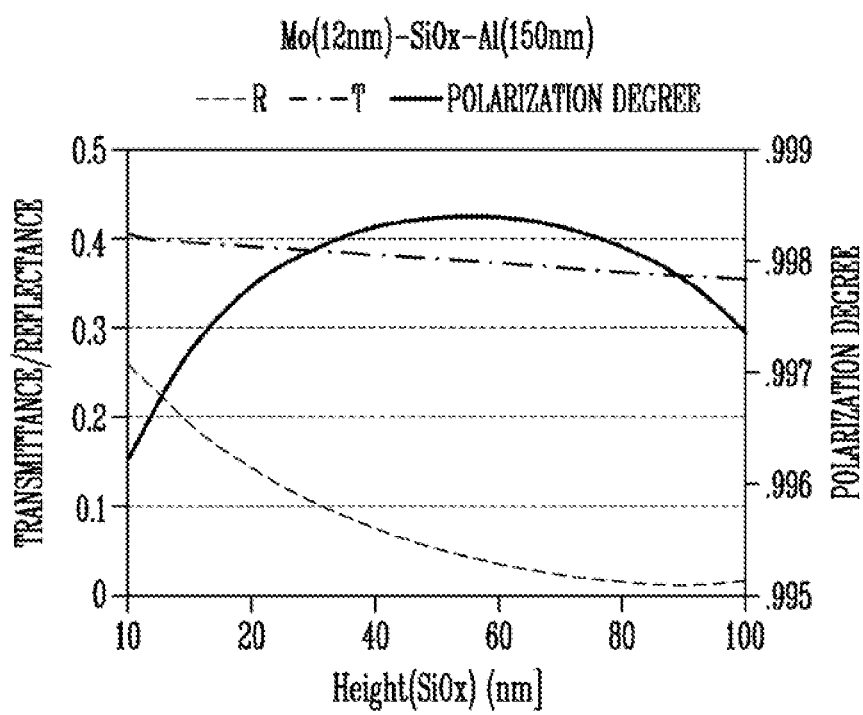
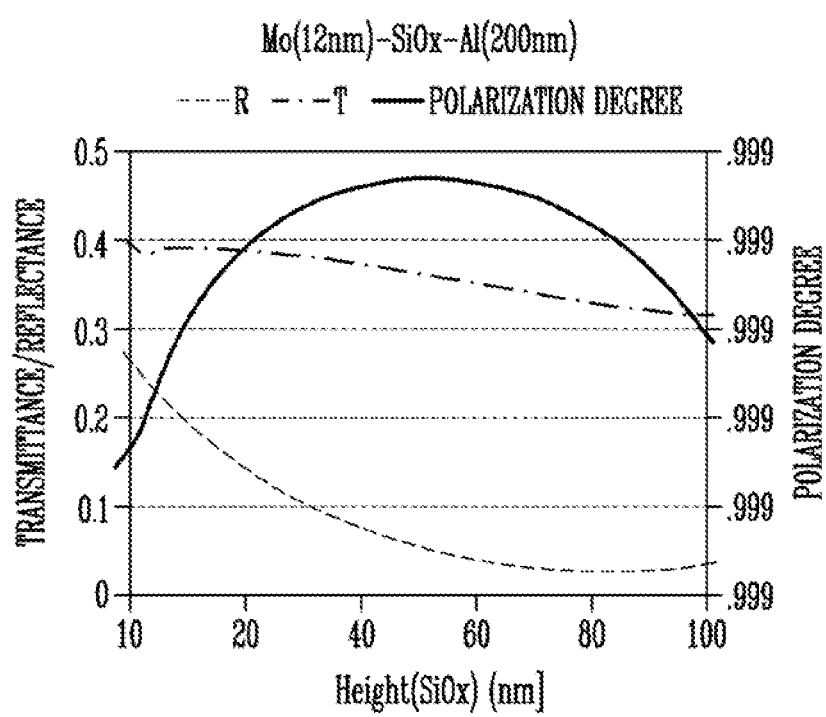

FIG. 17
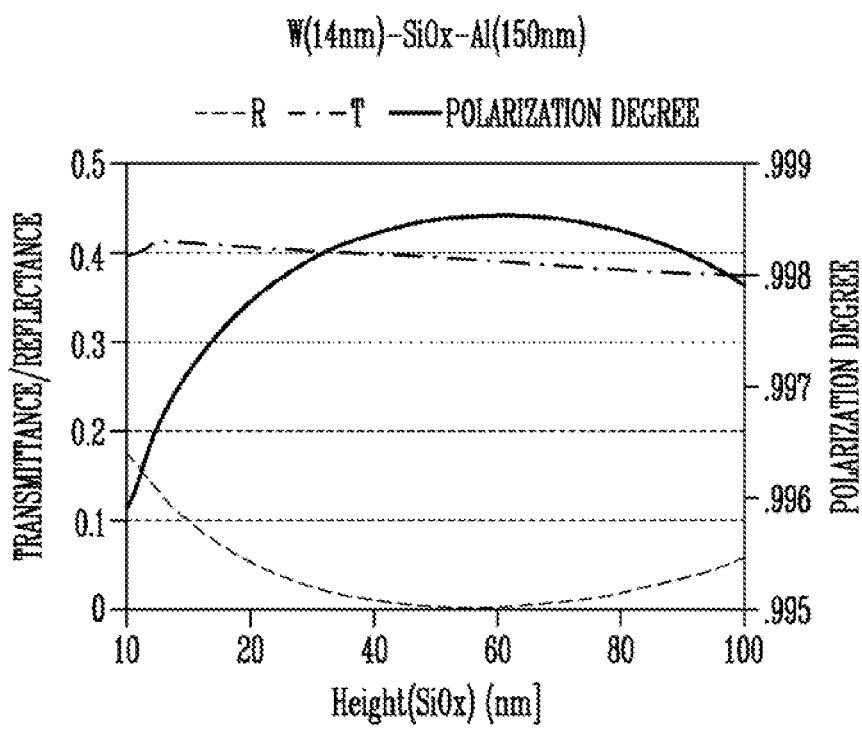
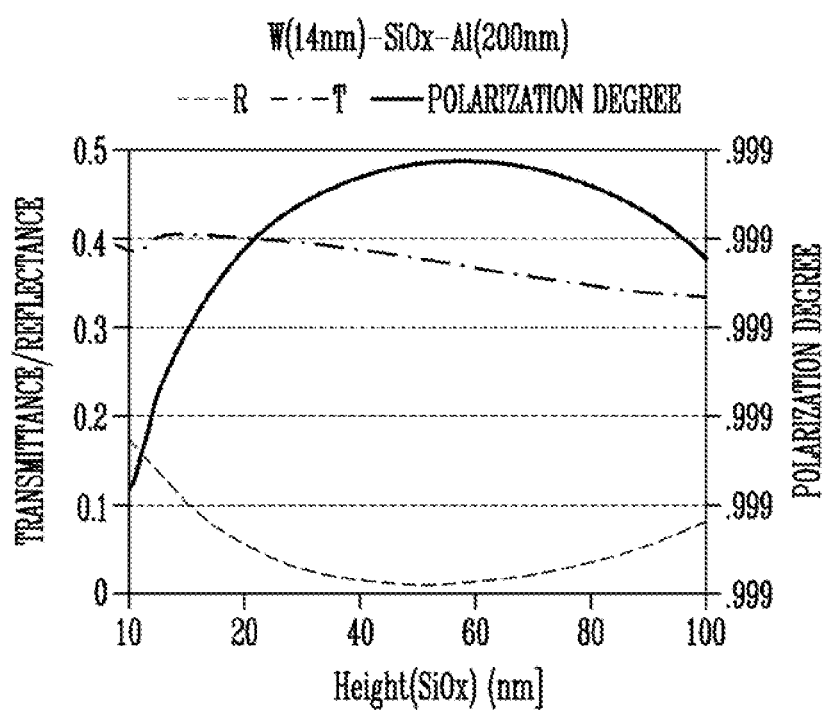

POLARIZING LAYER AND DISPLAY DEVICE HAVING THE SAME

CROSS-REFERENCE TO RELATED APPLICATION

The present application claims priority to Korean patent application number 10-2017-0074992, filed on Jun. 14, 2017, the entire disclosure of which is incorporated by reference herein in its entirety.

TECHNICAL FIELD

The present disclosure relates to a display device and, more specifically, to a polarizing layer and a display device having the polarizing layer.

DISCUSSION OF THE RELATED ART

Generally, a display device, such as a liquid crystal display (LCD), an electrowetting display device, an electrophoretic display device, or an organic light-emitting display device, may include a display panel for displaying an image. A polarizing layer may be disposed on at least one surface of the display panel.

To provide for a slim display device, the polarizing layer may have a thin structure and may be tightly integrated into the display panel.

SUMMARY

A polarizing layer includes a substrate and a plurality of parallel wires disposed on the substrate. Each of the plurality of wires includes a base layer disposed on the substrate and an anti-reflective layer disposed on the base layer. The base layer includes aluminum or an aluminum alloy. The anti-reflective layer has a thickness within a range of 12 nm to 40 nm.

A polarizing layer includes a substrate and a plurality of parallel wires disposed on the substrate. Each of the plurality of wires includes a base layer disposed on the substrate and an anti-reflective layer disposed on the base layer. The base layer includes aluminum or an aluminum alloy. The anti-reflective layer includes MoTaOx and has a thickness within a range of 45 nm to 100 nm.

A display device includes a first substrate including a first base substrate and a second base substrate. A first polarizing layer is disposed on the first base substrate. The first polarizing layer includes a plurality of first wires. A first driving layer is disposed on the first polarizing layer. The second substrate includes a second base substrate. A second polarizing layer is disposed on a first surface of the second base substrate and includes a plurality of second wires. A second driving layer is disposed on either the second polarizing layer or on a second surface of the second base substrate. A liquid crystal layer is disposed between the first substrate and the second substrate. Each of the plurality of first wires includes a first base layer disposed on a surface of the first base substrate that faces the second substrate. The first base layer includes aluminum or an aluminum alloy. A first anti-reflective layer is disposed on the first base layer. The first anti-reflective layer has a thickness within a range of 12 nm to 40 nm. Each of the plurality of second wires includes a second base layer disposed on the first surface of the second base substrate. The second base layer includes aluminum or an aluminum alloy. A second anti-reflective layer is disposed on the second base layer. The second anti-reflective layer has a thickness within a range of 12 nm to 40 nm.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 12 to 14 are graphs illustrating the transmittance, reflectance, and polarization degree of a polarizing layer that includes a wire grid polarizer, measured with respect to the thickness of a dielectric layer that includes silicon nitride;

FIGS. 15 to 17 are graphs illustrating the transmittance, reflectance, and polarization degree of a polarizing layer including a wire grid polarizer, measured with respect to the thickness of a dielectric layer that includes silicon oxide;

DETAILED DESCRIPTION

Figure 1:
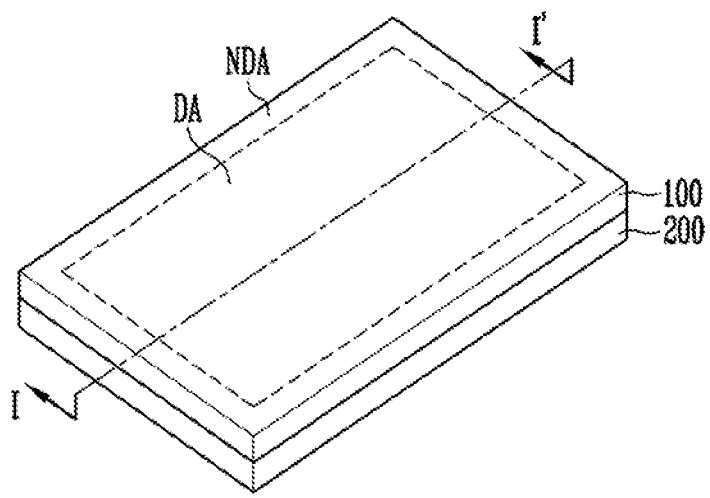
FIG. 1 is a perspective view illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Throughout the disclosure, the same reference numerals may be used to designate the same or similar elements throughout the drawings. The sizes of elements in the accompanying drawings may be exaggerated for clarity of illustration. It will be understood that, although the terms "first" and "second" may be used herein to describe various elements, these elements should not be limited by these terms. These terms are used to distinguish one element from other elements. For example, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

Furthermore, when a first part such as a layer, a film, a region, or a plate is disposed on a second part, the first part may be not only directly on the second part but one or more third parts may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. Hereinafter, exemplary embodiments of the present disclosure will be described in detail with reference to the accompanying drawings.

Figure 2:
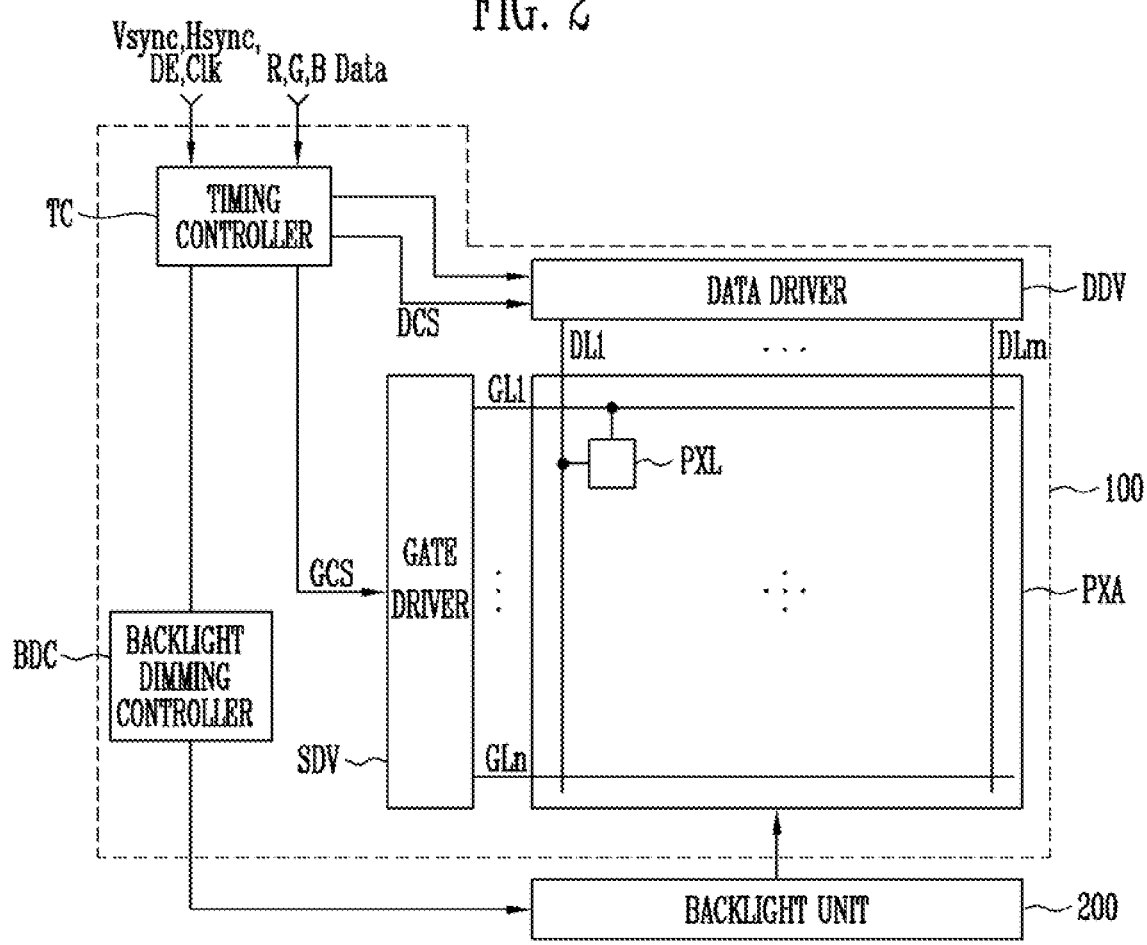
FIG. 2 is a schematic block diagram illustrating the display device of FIG. 1.

FIG. 1 is a perspective view illustrating a display device according to an exemplary embodiment of the present disclosure, and FIG. 2 is a block diagram schematically illustrating the display device of FIG. 1.

Referring to FIGS. 1 and 2, the display device may be provided in various shapes. For example, the display device may have a closed polygon shape including a plurality of rectilinear sides. The display device may have a circle or an ellipse shape including one or more curved sides. Alternatively, the display device may have a semicircle or a semiellipse shape including one or more rectilinear sides and one or more curved sides. In FIG. 1, a case where the display device has a rectangular shape is illustrated by way of example.

The display device may include a display panel 100 and a backlight unit 200.

The display panel 100 may a liquid crystal display (LCD) panel, an electrophoretic display (EPD) panel, an electrowetting display (EWD) panel, or an organic light-emitting diode (OLED) display panel. Further, when the display panel 100 is the OLED display panel, the OLED display panel is a self-emissive display panel, and thus the backlight unit 200 may be omitted. Hereinafter, for the convenience of description, the LCD panel will be described as an example of the display panel 100.

The display panel 100 may include a display area DA and a non-display area NDA.

The display area DA may be an area in which a pixel unit PXA is disposed and an image is displayed. The display area DA may have a shape corresponding to that of the display panel 100. For example, the display area DA may have a polygon shape including rectilinear sides. Further, the display area DA may have a circle or an ellipse shape including curved sides. Further, the display area DA may have a semicircle or a semiellipse shape including a rectilinear side and a curved side. In FIG. 1, a case where the display area DA has a rectangular shape is illustrated by way of example.

The pixel unit PXA may include a plurality of pixels PXL, each of which is connected to gate lines GL1 to GLn and data lines DL1 to DLm. Each pixel PXL may be connected to a corresponding gate line GL1, among the gate lines GL to GLn, and a corresponding data line DL1, among the data lines DL1 to DLm.

The non-display area NDA may be disposed on at least one side of the display area DA. For example, the non-display area NDA may be disposed on the perimeter of the display area DA.

A timing controller TC, a gate driver SDV, a data driver DDV, and/or a backlight dimming controller BDC, for example, the gate driver SDV, may be disposed in the non-display area NDA. The data driver DDV, the timing controller TC, and the backlight dimming controller BDC may be disposed outside of the display panel 100. Further, the data driver DDV, the timing controller TC, and the backlight dimming controller BDC may be disposed within a portion of the non-display area NDA.

The timing controller TC may receive digital video data from an external source through an interface, such as a Low Voltage Differential Signaling (LVDS) interface or a Transition Minimized Differential Signaling (TMDS) interface. Further, the timing controller TC may receive a vertical synchronization (sync) signal Vsync, a horizontal sync signal Hsync, a data enable signal DE, and a clock signal Clk from the external source. The timing controller TC may generate a gate control signal GCS and a data control signal DCS for respectively controlling the gate driver SDV and the data driver DDV using the signals.

The gate driver SDV may supply scan signals to the gate lines GL1 to GLn in response to the gate control signal GCS generated by the timing controller TC. For example, the gate driver SDV may sequentially supply the scan signals to the gate lines GL1 to GLn. When the scan signals are sequentially supplied to the gate lines GL1 to GLn, the pixels PXL may be selected in the unit of a horizontal line.

Alternatively, the gate driver SDV may supply the scan signals in the unit of multiple gate lines, among the gate lines GL1 to GLn.

The data driver DDV may supply data signals corresponding to one line to the data lines DL1 to DLm in response to the data control signal DCS, generated by the timing controller TC, for each horizontal period. The data signals supplied to the data lines D1 to Dm may be supplied to the pixels PXL selected by the scan signals. For this operation, the data driver DDV may supply the data signals to the data lines DL1 to DLm in synchronization with the scan signals.

The backlight dimming controller BDC may determine the dimming duty of a light source disposed within the backlight unit 200.

The backlight unit 200 may be disposed in a direction opposite to the light-exiting surface of the display panel 100, for example, below the display panel 100. The backlight unit 200 may be driven by the backlight dimming controller BDC to uniformly emit light to the display panel 100. Here, the backlight unit 200 may be a direct type backlight, which illuminates from directly behind the display panel 100, or an edge type backlight, which illuminates from one or more edges of the display panel 100.

Figure 3:
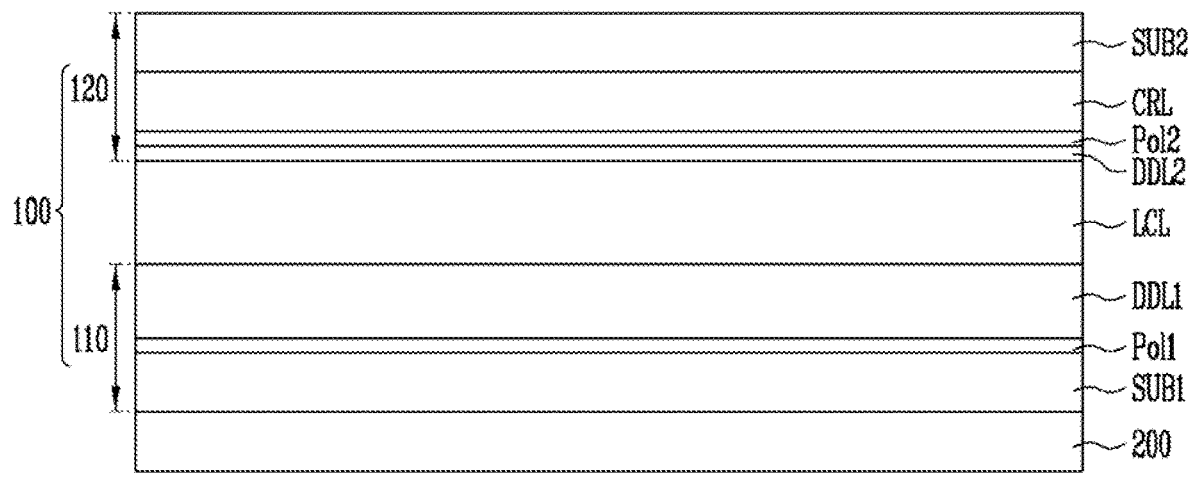
FIG. 3 is a schematic cross-sectional view illustrating the display device of FIG. 1.
Figure 4:
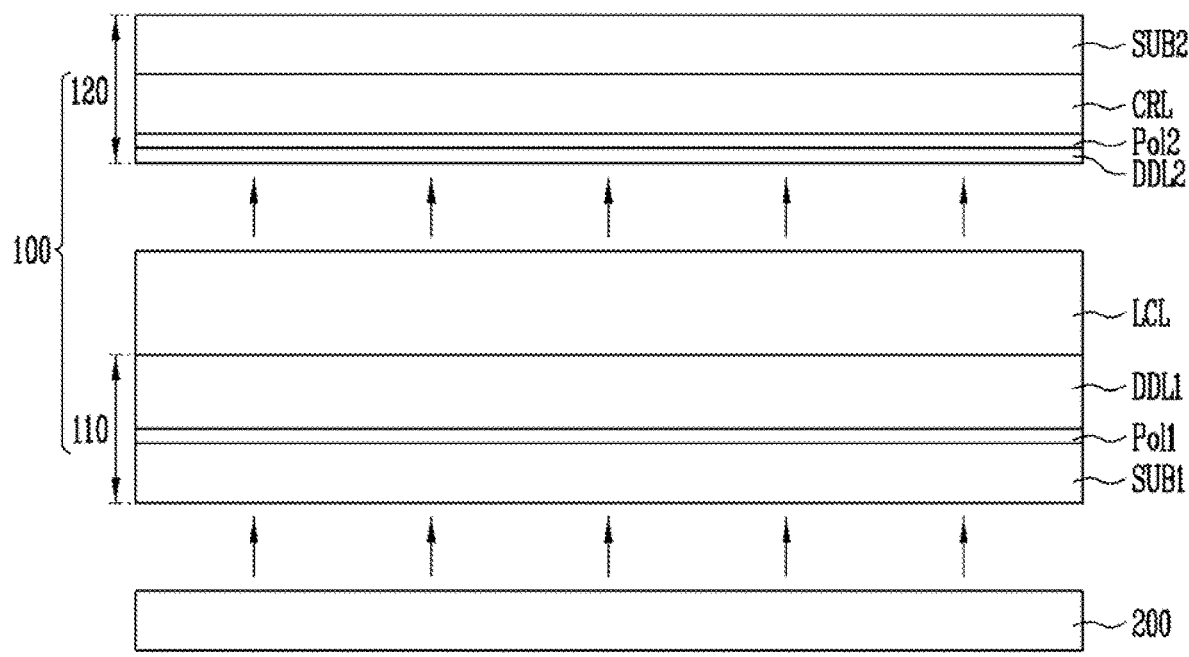
FIG. 4 is a diagram illustrating a traveling direction of light in the display device of FIG. 3.

FIG. 3 is a schematic cross-sectional view illustrating the display device of FIG. 1, and FIG. 4 is a diagram illustrating the traveling direction of light in the display device of FIG. 3.

Referring to FIGS. 3 and 4, the display device may include a display panel 100 and a backlight unit 200 disposed under (e.g. behind) the display panel 100.

The display panel 100 may include a first substrate 110, a second substrate 120, and a liquid crystal layer LCL disposed therebetween.

The first substrate 110 may include a first base substrate SUB1, a first driving layer DDL1, and a first polarizing layer Pol1 disposed therebetween.

The first base substrate SUB1 may include a transparent insulating material, thus allowing light to pass therethrough. The first base substrate SUB1 may be a rigid substrate. For example, the first base substrate SUB1 may include glass, quartz, glass-ceramic, and/or crystalline-glass.

Furthermore, the first base substrate SUB1 may be a flexible substrate. Here, the first base substrate SUB1 may be either a film substrate or a plastic substrate which includes a polymer organic material. For example, the first base substrate SUB1 may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the material used to form the first base substrate SUB may be variously changed, and may include, for example, fiber reinforced plastic (FRP).

In an exemplary embodiment of the present disclosure, the material applied to the first base substrate SUB1 may have resistance (or thermal resistance) to high treatment temperatures during a manufacturing process.

In each pixel PXL, the first driving layer DDL1 may be disposed on the first base substrate SUB1. For example, the first driving layer DDL1 may be disposed between the first base substrate SUB1 and the liquid crystal layer LCL. The first driving layer DDL1 may include at least one thin film transistor and a pixel electrode coupled to the thin film transistor. The pixel PXL refers to a smallest unit for displaying an image, and a plurality of pixels PXL may be disposed in the pixel unit PXA.

The first polarizing layer Pol1 may polarize light provided from the backlight unit 200 in a specific direction and may then provide the polarized light to the liquid crystal layer LCL.

The first polarizing layer Pol1 may be disposed on a first surface of the first base substrate SUB1. For example, the first polarizing layer Pol1 may be disposed between the first base substrate SUB1 and the first driving layer DDL1. When the first polarizing layer Pol1 is disposed between the first base substrate SUB1 and the first driving layer DDL1, the first polarizing layer Pol1 may include a wire grid polarizer (WGP). The wire grid polarizer (WGP) may be implemented as an array of regularly spaced fine metal wires that are arranged in parallel. The wire grid polarizer (WGP) may perform the same function as a typical polarizer. For example, the wire grid polarizer (WGP) may be configured such that the metal wires are arranged at intervals of a length below the wavelength of incident light without orientating a material forming the polarizer, and may be formed using a patterning process. Therefore, the wire grid polarizer (WGP) may be formed via patterning based on photolithography.

When the first polarizing layer Pol1 is disposed between the first base substrate SUB1 and the first driving layer DDL1, the first substrate 110 may include a first passivation layer disposed between the first polarizing layer Pol1 and the first driving layer DDL1.

On the other hand, although, in the present exemplary embodiment, the first polarizing layer Pol1 is described as being disposed between the first base substrate SUB1 and the first driving layer, the present disclosure is not limited thereto. For example, the first polarizing layer Pol1 may alternatively be disposed between the first base substrate SUB1 and the backlight unit 200. For example, the first polarizing layer Pol1 may be disposed on an outer surface of the first base substrate SUB1.

The second substrate 120 may face the first substrate 110. The second substrate 120 may include a second base substrate SUB2, a color representation layer CRL, a second polarizing layer Pol2, and a second driving layer DDL2.

The second base substrate SUB2 may include the same material as the first base substrate SUB1.

The color representation layer CRL may be disposed on a first surface of the second base substrate SUB2, for example, on a surface facing the first substrate 110. The color representation layer CRL may include a plurality of color filters and a light-blocking pattern disposed between the color filters.

The color filters may implement predetermined colors using light provided from the backlight unit 200. For example, each of the color filters may be red, green, blue, white, cyan, magenta, or yellow. At least one of the color filters may include an organic material and a quantum dot material dispersed within the organic material. The quantum dot material may convert light having a first color, provided from the backlight unit 200, into light having a second color different from the first color.

Although an example in which the color filters are included in the color representation layer CRL is described, the present invention is not limited to such an example. For example, the color filters may also be integrated into the first substrate 110.

The second polarizing layer Pol2 may transmit light that has passed through the liquid crystal layer LCL. The second polarizing layer Pol2 may include a wire grid polarizer (WGP), similar to the first polarizing layer Pol1.

Although an example in which the second polarizing layer Pol2 is disposed between the color representation layer CRL and the second driving layer DDL2, as illustrated in FIG. 3, is described, the present invention is not limited to such an example. For example, the second polarizing layer Pol2 may also be disposed on an outer surface of the second base substrate SUB2, for example, on one of both surfaces of the second base substrate SUB2 on which the second driving layer DDL2 is not disposed.

The second driving layer DDL2 may be disposed on the second polarizing layer Pol2. The second driving layer DDL2 may include a common electrode, which forms an electric field together with the pixel electrode. Here, the common electrode may form a vertical electric field together with the pixel electrode. The second driving layer DDL2 may be integrated with the first driving layer DDL1. When the second driving layer DDL2 is integrated with the first driving layer DDL1, the pixel electrode and the common electrode may form a horizontal electric field.

The liquid crystal layer LCL may be disposed between the first substrate 110 and the second substrate 120. The liquid crystal molecules of the liquid crystal layer LCL may be arranged in a specific direction due to the electric field formed by the pixel electrode and the common electrode, and may then adjust the transmittance of light. Therefore, the liquid crystal layer LCL may transmit light that has been provided from the backlight unit 200, thus enabling the liquid crystal display panel 100 to display an image.

The backlight unit 200 may be arranged outside of the display panel 100, and may then provide light to the liquid crystal layer LCL. The backlight unit 200 may include a light guide plate, a light source unit including a plurality of light sources, an optical element, and a reflective sheet.

The light guide plate may be disposed under the display panel 100. The light guide plate may guide light emitted from the light source unit to the display panel 100, thus enabling the light to exit in the direction of the display panel 100. For example, the light guide plate may at least partially overlap the display area DA of the display panel 100.

The light source unit may supply light to one side surface of the light guide plate or to the lower surface of the light guide plate. For example, when the backlight unit 200 is implemented in a direct type, the light source unit may supply light to the lower surface of the light guide plate. Alternatively, when the backlight unit 200 is implemented in an edge type, the light source unit may supply light to one side surface of the light guide plate. The light source unit may have a form in which a plurality of light-emitting diodes is mounted on a printed circuit board (PCB). Here, each of the light-emitting diodes may emit light having the same color. For example, each of the light-emitting diodes may emit blue light.

Although an example in which all of the light-emitting diodes emit light having the same color is described, the present invention is not limited thereto. For example, the light-emitting diodes may emit light having different colors, and thus the light emitted from the light-emitting diodes may be mixed to form a single color, for example, a white color.

The optical element may be disposed between the light guide plate and the display panel 100. The optical element may control light that is provided from the light source unit and exits from the light guide plate. Further, the optical element may include a diffusion sheet, a prism sheet, and a protective sheet which are sequentially stacked.

The diffusion sheet may diffuse the light exiting from the light guide plate. The prism sheet may condense the light diffused by the diffusion sheet to allow the light to travel above the prism sheet in a direction vertical to the plane of the display panel 100. Therefore, most of the light having passed through the prism sheet may be vertically incident on the display panel 100. The protective sheet may be disposed on the prism sheet. The protective sheet may protect the prism sheet from external impacts.

Although an example in which the optical element is composed of one diffusion sheet, one prism sheet, and one protective sheet is described, the present invention is not limited thereto. The optical element may be used in such a way that the diffusion sheet, the prism sheet, and/or the protective sheet is provided in a plural number and then overlaid. Alternatively, any one sheet may be omitted.

The reflective sheet may be disposed on a first surface of the light guide plate, for example, on the opposite surface of the display panel 100. The reflective sheet may reflect light that is leaked without being provided in the direction of the display panel 100, of the light emitted from the light source unit, and may change the path of the leaked light to the direction of the display panel 100. The reflective sheet may contain a material that reflects light. Therefore, the reflective sheet may increase the amount of light provided to the display panel 100.

Figure 5:
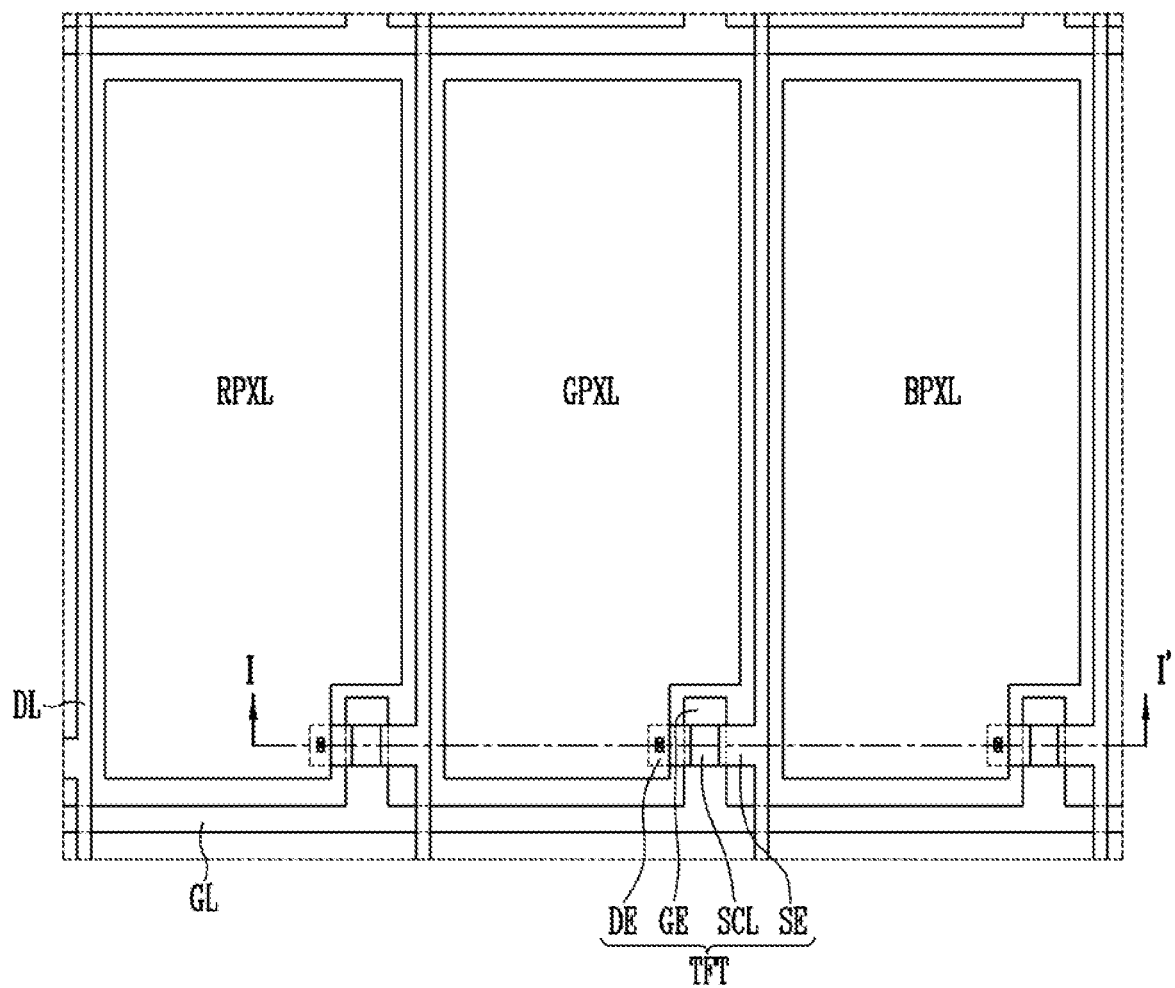
FIG. 5 is a plan view illustrating RGB pixels of a display panel illustrated in FIGS. 1 to 4.
Figure 6:
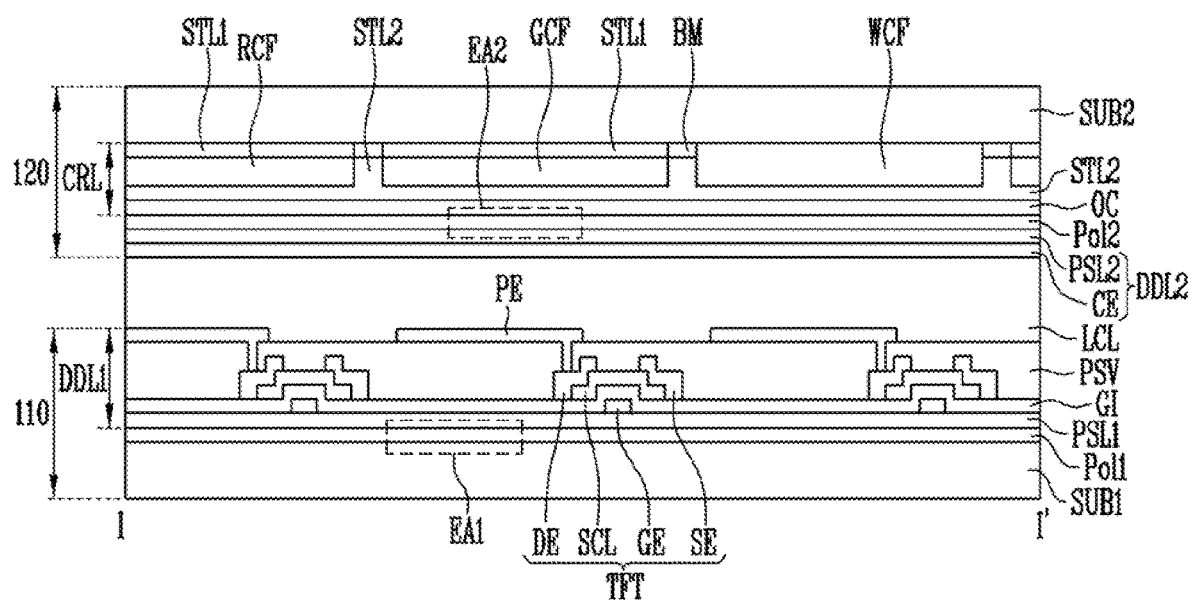
FIG. 6 is a cross-sectional view taken along line I-I' of FIG. 5.
Figure 7:
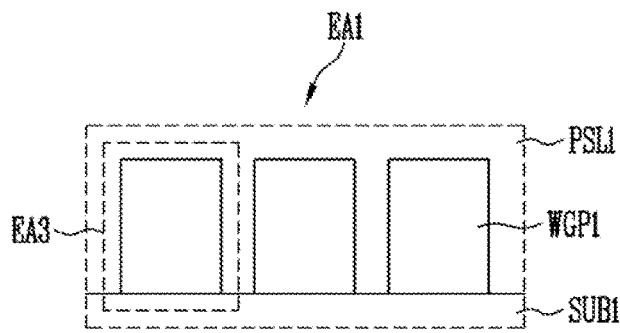
FIG. 7 is an enlarged view of region EA1 of FIG. 6.
Figure 8:
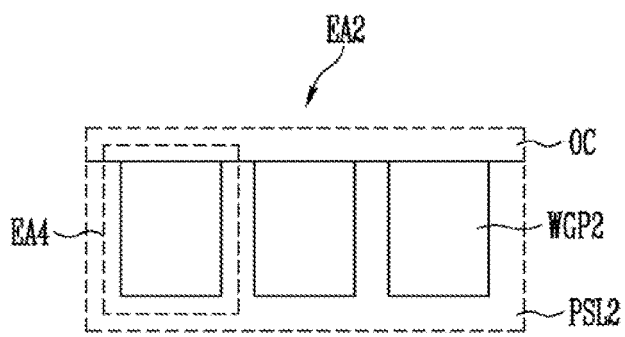
FIG. 8 is an enlarged view of region EA2 of FIG. 6.
Figure 9:
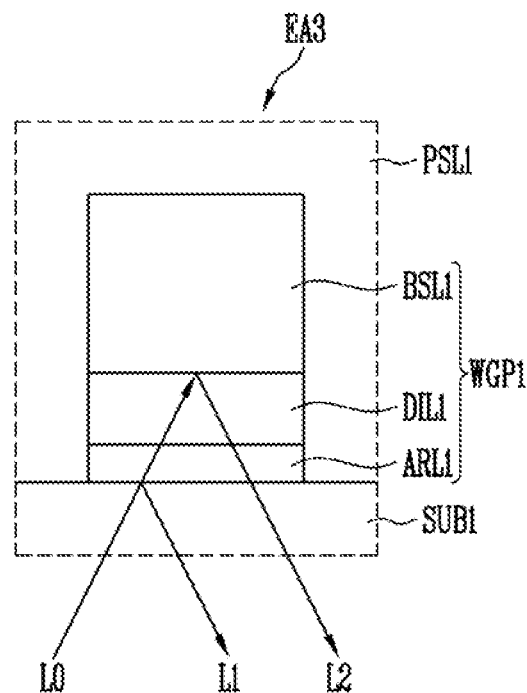
FIG. 9 is an enlarged view of region EA3 of FIG. 7.
Figure 10:
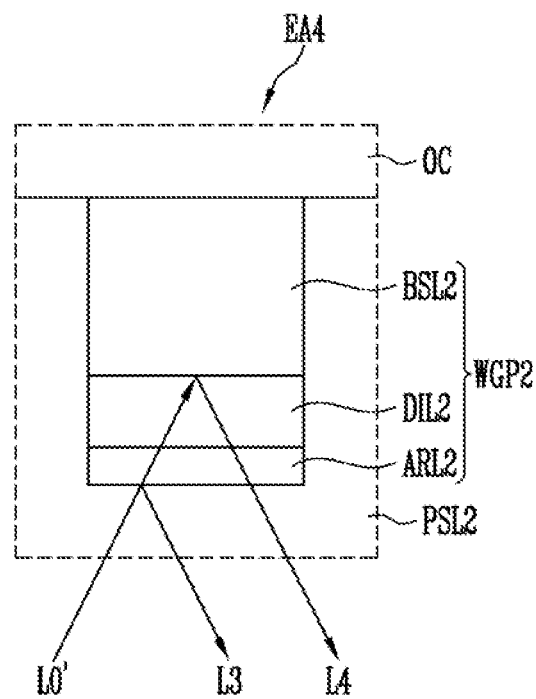
FIG. 10 is an enlarged view of region EA4 of FIG. 8.

FIG. 5 is a plan view illustrating RGB pixels of the display panel illustrated in FIGS. 1 to 4. FIG. 6 is a cross-sectional view taken along line I-I' of FIG. 5. FIG. 7 is an enlarged view of region EA1 of FIG. 6. FIG. 8 is an enlarged view of region EA2 of FIG. 6. FIG. 9 is an enlarged view of region EA3 of FIG. 7. FIG. 10 is an enlarged view of region EA4 of FIG. 8.

Referring to FIGS. 5 to 10, the display panel 100 may include a red pixel RPXL, a green pixel GPXL, and a blue pixel BPXL. Further, the display panel 100 may include a first substrate 110, a second substrate 120, and a liquid crystal layer LCL disposed therebetween.

The first substrate 110 may include a first base substrate SUB1, a first driving layer DDL1, and a first polarizing layer Pol1 disposed therebetween.

The first base substrate SUB may either be a rigid substrate or a flexible substrate, which may include a transparent insulating material.

The first driving layer DDL1 may be disposed on the first base substrate SUB1, and may include at least one thin film transistor TFT and a pixel electrode PE coupled to the thin film transistor TFT.

The first polarizing layer Pol1 may polarize light provided from a backlight unit (see 200 of FIGS. 3 and 4) in a specific direction and may then provide the polarized light to the liquid crystal layer LCL. The first polarizing layer Pol1 may be disposed between the first base substrate SUB1 and the first driving layer DDL1.

The first substrate 110 may further include a first passivation layer PSL1 disposed between the first polarizing layer Pol1 and the first driving layer DDL1. The first passivation layer PSL1 may insulate the first polarizing layer Pol1 and the first driving layer DDL1 from each other.

The first polarizing layer Pol1 may include a plurality of first wires WGP1 disposed between the first base substrate SUB1 and the first passivation layer PSL. Each of the first wires WGP1 may include a first base layer BSL1, a first anti-reflective layer ARL1, and a first dielectric layer DIL1.

The first base layer BSL1 may be disposed on the first base substrate SUB1. The first base layer BSL1 may include aluminum (Al) or an aluminum alloy (Al alloy). The thickness of the first base layer BSL1 may be 140 nm to 220 nm.

The first anti-reflective layer ARL1 may be disposed between the first base substrate SUB1 and the first base layer BSL1. The first anti-reflective layer ARL1 may include a material, the refractive index η of which ranges from 1.3 to 3.5 and the absorption coefficient κ of which ranges from 0.3 to 4.0 within a wavelength range of 250 nm to 550 nm. For example, the first anti-reflective layer ARL1 may include tungsten (W), molybdenum (Mo), titanium (Ti), and/or an alloy of these materials. The thickness of the first anti-reflective layer ARL1 may be 12 nm to 40 nm.

Furthermore, the first anti-reflective layer ARL1 may include MoTaOx. MoTaOx may be a mixture in which tantalum (Ta) is mixed with molybdenum oxide (MoOx). In this case, the thickness of the first anti-reflective layer ARL1 may be 45 nm to 100 nm.

The first dielectric layer DIL1 may be disposed between the first base layer BSL1 and the first anti-reflective layer ARL1. The first dielectric layer DIL1 may include a transparent dielectric material, the refractive index η of which ranges from 1.3 to 2.2 and the absorption coefficient κ of which ranges from 0 to 0.5. For example, the first dielectric layer DIL1 may include silicon nitride (SiNx), silicon oxide (SiOx), and/or silicon oxynitride (SiON). The thickness of the first dielectric layer DIL1 may be 0 to 100 nm. For example, when the first anti-reflective layer ARL1 includes tungsten (W) and the first dielectric layer DIL1 includes silicon nitride, the thickness of the first dielectric layer DIL1 may be 20 nm to 70 nm. When the first anti-reflective layer ARL1 includes molybdenum (Mo) and the first dielectric layer DIL1 includes silicon nitride, the thickness of the first dielectric layer DIL1 may be 40 nm to 85 nm. Further, when the first anti-reflective layer ARL1 includes titanium (Ti) and the first dielectric layer DIL1 includes silicon nitride, the thickness of the first dielectric layer DIL1 may be 45 nm to 85 nm. Furthermore, even if the material of the first anti-reflective layer ARL1 includes tungsten (W), molybdenum (Mo), titanium (Ti), and/or MoTaOx, the thickness of the first dielectric layer DIL1, including silicon nitride, may be 45 nm to 70 nm.

When the first anti-reflective layer ARL1 includes tungsten (W) and the first dielectric layer DIL1 includes silicon oxide, the thickness of the first dielectric layer DIL1 may be 20 nm to 90 nm. Further, when the first anti-reflective layer ARL1 includes molybdenum (Mo) and the first dielectric layer DIL1 includes silicon oxide, the thickness of the first dielectric layer DIL1 may be 50 nm to 100 nm. When the first anti-reflective layer ARL1 includes titanium (Ti) and the first dielectric layer DIL1 includes silicon oxide, the thickness of the first dielectric layer DIL1 may be 60 nm to 90 nm. Even if the material of the first anti-reflective layer ARL1 includes tungsten (W), molybdenum (Mo), titanium (Ti), and/or MoTaOx, the thickness of the first dielectric layer DIL1, including silicon oxide, may be 60 nm to 90 nm.

When the pitch of the first wires WGP1 is less than the wavelength of first incident light L0 that is incident on the first polarizing layer Pol1, the first polarizing layer Pol1 might not cause the diffraction of the first incident light L0 due to the grid shape of the first wires WGP1. The first polarizing layer Pol1, including the first wires WGP1, may polarize or extinguish the first incident light L0 depending on the direction in which the first incident light L0 vibrates. Here, the first incident light L0 may be light supplied from the backlight unit 200.

Here, the first polarizing layer Pol1 may transmit P-polarized light of the first incident light L0.

Part of S-polarized light may be absorbed in or reflected from the first anti-reflective layer ARL1, and the remaining part of the S-polarized light may pass through the first anti-reflective layer ARL1 and may be reflected from the first base layer BSL1. First reflected light L1 reflected from the first anti-reflective layer ARL1 and second reflected light L2 reflected from the first base layer BSL1 may satisfy destructive interference conditions depending on the thickness of the first dielectric layer DIL1. For example, the first dielectric layer DIL11 may provide a path for forming a phase difference so that the first reflected light L1 and the second reflected light L2 may cause destructive interference. For example, part of the S-polarized light may be absorbed and extinguished in the first anti-reflective layer ARL1, and the remaining part of the S-polarized light may be extinguished depending on the destructive interference conditions. Therefore, the first polarizing layer Pol1 may prevent the S-polarized light of the first incident light L0 that is supplied from the backlight unit 200 from being reflected.

If the first polarizing layer Pol1 cannot extinguish the S-polarized light and the S-polarized light is reflected from the first polarizing layer Pol1, the S-polarized light may be bounced back and forth between the reflective sheet of the backlight unit 200 and the first polarizing layer Pol1. Part of the S-polarized light reflected between the reflective sheet of the backlight unit 200 and the first polarizing layer Pol1 may be leaked to the side surface of the display panel 100 during the repetitive reflection. Therefore, the image quality of the side surface of the display panel 100 may be deteriorated.

In each pixel RPXL, GPXL, and/or BPXL, the first driving layer DDL1 may include at least one thin film transistor TFT disposed on the first passivation layer PSL1, and a pixel electrode PE connected to the thin film transistor TFT.

The thin film transistor TFT may include a gate electrode GE, a semiconductor layer SCL, a source electrode SE, and a drain electrode DE.

The thin film transistor TFT will be described in detail below.

The gate electrode GE may be disposed on the first passivation layer PSL1. The gate electrode GE may be connected to a gate line GL. For example, the gate electrode GE may have a shape in which a part of the gate line GL protrudes.

A gate insulating layer GI that covers the gate electrode GE may be disposed on the gate electrode GE. The gate insulating layer GI may also at least partially cover the first passivation layer PSL1 together with the gate electrode GE. The gate insulating layer GI may include an organic insulating material and/or an inorganic insulating material. For example, the gate insulating layer GI may include silicon oxide and/or silicon nitride.

The semiconductor layer SCL may be disposed on the gate insulating layer GI. The semiconductor layer SCL may at least partially overlap the gate electrode GE. The semiconductor layer SCL may include amorphous silicon (a-Si), poly crystalline silicon (p-Si), and/or an oxide semiconductor. Further, on the semiconductor layer SCL, a region coupled to the source electrode SE and a region coupled to the drain electrode DE may be a source region and a drain region with or into which impurities have been doped or injected. An area between the source region and the drain region may be a channel area. Here, the oxide semiconductor may include Zn, In, Ga, Sn, and/or mixtures thereof. For example, the oxide semiconductor may include Indium-Gallium-Zinc Oxide (IGZO).

A first end of the source electrode SE may be coupled to a data line DL crossing the gate line GL. For example, the source electrode SE may have a shape in which a part of the data line DL protrudes. A second end of the source electrode SE may be coupled to a first end of the semiconductor layer SCL, for example, the source region.

The drain electrode DE may be spaced apart from the source electrode SE. A first end of the drain electrode DE may be coupled to a second end of the semiconductor layer SCL, for example, the drain region, and a second end of the drain electrode DE may be coupled to the pixel electrode PE.

In the above exemplary embodiment, although a bottom-gate TFT in which the gate electrode GE of the thin film transistor TFT is located below the semiconductor layer SCL is described by way of example, the TFT structure is not limited thereto. For example, the thin film transistor TFT may be a top-gate TFT in which the gate electrode GE is located above the semiconductor layer SCL.

The first substrate 110 may further include a protective layer PSV disposed on the thin film transistor TFT. The protective layer PSV may at least partially cover the thin film transistor TFT and may expose a second end of the drain electrode DE.

The protective layer PSV may include an inorganic protective layer and/or an organic protective layer. For example, the protective layer PSV may include an inorganic protective layer for covering the thin film transistor TFT and an organic protective layer disposed on the inorganic protective layer. The inorganic protective layer may include silicon oxide and/or silicon nitride. For example, the inorganic protective layer may at least partially cover the thin film transistor TFT. The organic protective layer may include an organic insulating layer that allows light to pass therethrough. For example, the organic protective layer may include polyacrylates resin, epoxy resin, phenolic resin, polyamides resin, polyimides resin, unsaturated polyesters resin, poly-phenylen ethers resin, poly-phenylene sulfides resin, and/or enzocyclobutene resin.

The pixel electrode PE may be disposed on the protective layer PSV. The pixel electrode PE may be coupled to a second end of the drain electrode DE. The pixel electrode PE may include a transparent conductive oxide. For example, the pixel electrode PE may include Indium Tin Oxide (ITO), Indium Zinc Oxide (IZO), Aluminum Zinc Oxide (AZO), Gallium doped Zinc Oxide (GZO), Zinc Tin Oxide (ZTO), Gallium Tin Oxide (GTO), and/or Fluorine doped Tin Oxide (FTO).

The pixel electrode PE may include a plurality of slits to control an arrangement of liquid crystal molecules contained in the liquid crystal layer LCL.

Further, a first alignment layer may be disposed on the pixel electrode PE. The first alignment layer is configured to initially align the liquid crystal layer LCL disposed between the first substrate 110 and the second substrate 120, and may include a polymer material in which a reaction corresponding to one of decomposition, dimerization, and isomerization occurs due to the radiation of light (e.g., ultraviolet rays (UV) or laser light). Furthermore, the first alignment layer may include a polymer material in which reactive mesogen (RM) is polymerized.

The second substrate 120 may be an opposite substrate that faces the first substrate 110. The second substrate 120 may include a second base substrate SUB2, a color representation layer CRL, a second polarizing layer Pol2, and a second driving layer DDL2.

The second base substrate SUB2 may include the same material as the first base substrate SUB1.

The color representation layer CRL may be disposed on a first surface of the second base substrate SUB2, for example, on a surface facing the first substrate 110. The color representation layer CRL may include a light-blocking pattern BM arranged in an area between pixels RPXL, GPXL, and BPXL, adjacent to each other, on the second base substrate SUB2. A first selective transmission layer STL1 may be disposed on the second base substrate SUB2 to correspond to the red pixel RPXL and the green pixel GPXL. A first color filter RCF and a second color filter GCF may be disposed on the first selective transmission layer STL1. A third color filter WCF may be disposed on the second base substrate SUB2 to correspond to the blue pixel BPXL. A second selective transmission layer STL2 may cover at least the first color filter RCF and the second color filter GCF. A planarization layer OC may be disposed on the second selective transmission layer STL2.

The light-blocking pattern BM may expose areas corresponding to the red pixel RPXL, the green pixel GPXL, and the blue pixel BPXL of the second base substrate SUB2, for example, a red pixel area, a green pixel area, and a blue pixel area. The light-blocking pattern BM may prevent a phenomenon in which light that has been provided from the backlight unit 200 and that has passed through the liquid crystal layer LCL and any one of the color filters RCF, GCF, and WCF is mixed with light that has passed through other color filters RCF, GCF, or WCF, and in which color reproducibility is then deteriorated. Further, the light-blocking pattern BM may prevent external light from being incident on the display panel 100 and being reflected from the display panel 100.

The first selective transmission layer STL1 may block blue light from the light having passed through the first color filter RCF and the second color filter GCF and may transmit the remaining light. The reason for this is that the light source of the backlight unit 200 is a light-emitting diode which emits blue light. Therefore, the first selective transmission layer STL1 may increase the color reproducibility of the display panel 100.

The first color filter RCF, the second color filter GCF, and the third color filter WCF may implement predetermined colors using the light provided from the backlight unit 200. For example, the first color filter RCF may implement red light, the second color filter GCF may implement green light, and the third color filter WCF may implement blue light.

Each of the first color filter RCF and the second color filter GCF may include an organic material and a quantum dot material dispersed within the organic material. The quantum dot material included in the first color filter RCF may absorb blue light and may convert the blue light into red light. The quantum dot material included in the second color filter GCF may absorb blue light and may convert the blue light into green light. Therefore, the first color filter RCF and the second color filter GCF may convert blue light provided from the backlight unit 200 into red light and green light, respectively.

The third color filter WCF may transmit blue light provided from the backlight unit 200. For example, the third color filter WCF may be a transparent, blue or white color filter.

In the present exemplary embodiment, although an example in which the first color filter RCF, the second color filter GCF, and the third color filter WCF implement red light, green light, and blue light, respectively, is described, the present invention is not limited to such an example. For example, the first color filter RCF, the second color filter GCF, and the third color filter WCF may implement light having a color corresponding to any one of white, cyan, magenta, and yellow.

The second selective transmission layer STL2 may at least partially cover at least the first color filter RCF and the second color filter GCF, among the first color filter RCF, the second color filter GCF, and the third color filter WCF. For example, as illustrated in FIG. 6, the second selective transmission layer STL2 may at least partially cover the first color filter RCF, the second color filter GCF, and the third color filter WCF.

The second selective transmission layer STL2 may reflect yellow light and may transmit the remaining light. Since the yellow light is a mixture of red light and green light, the second selective transmission layer STL2 may reflect the red light and the green light converted by the first color filter RCF and the second color filter CF, respectively. Further, the second selective transmission layer STL2 may reflect light other than blue light, among the light that is incident on the third color filter WCF. Therefore, the second selective transmission layer STL2 may increase the color reproducibility of the display panel 100.

The planarization layer OC may include a transparent organic material. The planarization layer OC may at least partially cover the second selective transmission layer STL2. Therefore, the planarization layer OC may planarize the surface of the second selective transmission layer STL2.

The second polarizing layer Pol2 may be disposed on the color representation layer CRL and may then selectively transmit or block light that has passed through the liquid crystal layer LCL. The second polarizing layer Pol2 may include a plurality of second wires WGP2 disposed between the color representation layer CRL and the second driving layer DDL2. Each of the second wires WGP2 may include a second base layer BSL2, a second anti-reflective layer ARL2, and a second dielectric layer DIL2.

The second base layer BSL2 may be disposed between the color representation layer CRL and the second driving layer DDL2. The second base layer BSL2 may include the same material as the first base layer BSL1. Further, the thickness of the second base layer BSL2 may have the same range as the thickness of the first base layer BSL1.

The second anti-reflective layer ARL2 may be disposed between the second base layer BSL2 and the second driving layer DDL2. The second anti-reflective layer ARL2 may include the same material as the first anti-reflective layer ARL1. Furthermore, the thickness of the second anti-reflective layer ARL2 may have the same range as the thickness of the first anti-reflective layer ARL1.

The second dielectric layer DIL2 may be disposed between the second base layer BSL2 and the second anti-reflective layer ARL2. The second dielectric layer DIL2 may include the same material as the first dielectric layer DIL1. Further, the thickness of the second dielectric layer DIL2 may have the same range as the thickness of the first dielectric layer DIL1.

When the pitch of the second wires WGP2 is less than the wavelength of second incident light L0' that is incident on the second polarizing layer Pol2, the second polarizing layer Pol2 might not cause the diffraction of the second incident light L0' due to the grid shape of the second wires WGP2. The second polarizing layer Pol2 including the second wires WGP2 may polarize or extinguish the second incident light L0' depending on the direction in which the second incident light L0' vibrates. Here, the second incident light L0' may be light that has passed through the liquid crystal layer LCL and is traveling along the direction of the second substrate 120.

The second polarizing layer Pol2 may transmit P-polarized light of the second incident light L0'.

Part of S-polarized light may be absorbed in or reflected from the second anti-reflective layer ARL2, and the remaining part of the S-polarized light may pass through the second anti-reflective layer ARL2 and may be reflected from the second base layer BSL2. Third reflected light L3 reflected from the second anti-reflective layer ARL2 and fourth reflected light LA reflected from the second base layer BSL2 may satisfy destructive interference conditions depending on the thickness of the second dielectric layer DIL2. For example, the second dielectric layer DIL2 may provide a path for forming a phase difference so that the third reflected light L3 and the fourth reflected light L4 may cause destructive interference. For example, part of the S-polarized light may be absorbed and extinguished in the second anti-reflective layer ARL2, and the remaining part of the S-polarized light may be extinguished depending on the destructive interference conditions.

Therefore, the second polarizing layer Pol2 may prevent the leakage of light from occurring due to the S-polarized light of the second incident light L0' that has passed through the liquid crystal layer LCL and that is supplied to the second substrate 120.

If the second polarizing layer Pol2 cannot extinguish the S-polarized light, and the S-polarized light is reflected from the second polarizing layer Pol2, the S-polarized light may be repeatedly reflected between the first polarizing layer Pol1 and the second polarizing layer Pol2. Part of the S-polarized light that is repeatedly reflected between the first polarizing layer Pol1 and the second polarizing layer Pol2 may be leaked to the side surface of the display panel 100 during the repetitive reflection. Therefore, the image quality of the side surface of the display panel 100 may be deteriorated.

The second driving layer DDL2 may include a second passivation layer PSL2 arranged on the second polarizing layer Pol2 and a common electrode CE arranged on the second passivation layer PSL2.

The second passivation layer PSL2 may insulate the second polarizing layer Pol2 and the common electrode CE from each other. Further, the second passivation layer PSL2 may at least partially cover the second wires WGP2 and may fill spaces between adjacent second wires WGP2. Therefore, the second passivation layer PSL2 may planarize the surface of the second polarizing layer Pol2. The second passivation layer PSL2 may include a material, the refractive index η of which ranges from 1 to 1.4.

The common electrode CE may form an electric field together with the pixel electrode PE. The common electrode CE may include a transparent conductive oxide. For example, the common electrode CE may include the same material as the pixel electrode PE.

Further, a second alignment layer may be disposed on the common electrode CE. The second alignment layer may initially align the liquid crystal layer LCL disposed between the first substrate 110 and the second substrate 120. The second alignment layer may include the same material as the first alignment layer.

Figure 11:
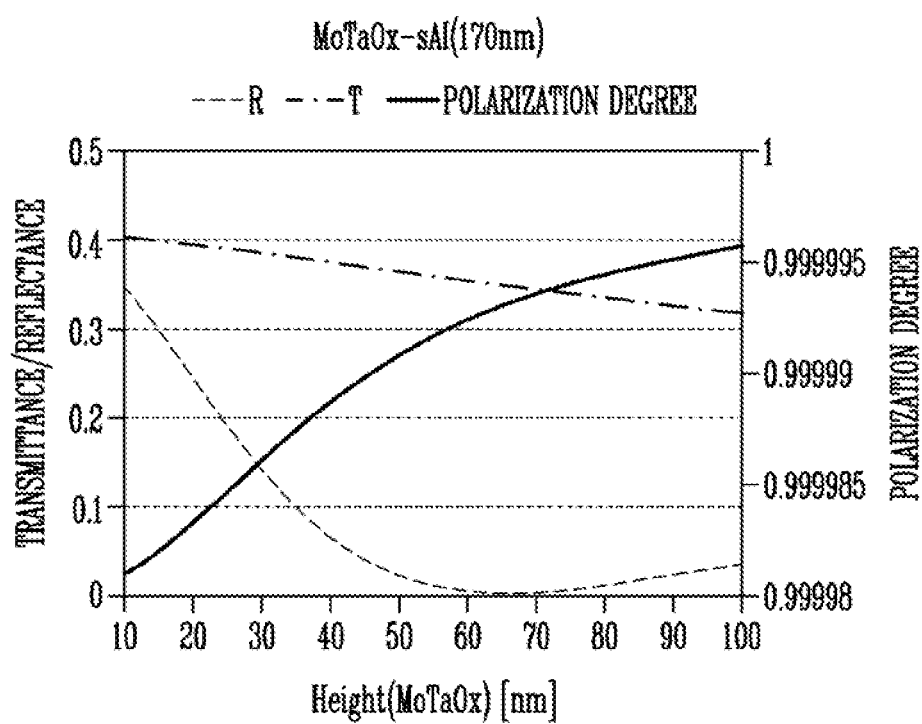
FIG. 11 is a graph illustrating transmittance, reflectance, and polarization degree of a polarizing layer, measured with respect to the thickness of an anti-reflective layer, wherein the polarizing layer includes a wire grid polarizer including a base metal layer and the anti-reflective layer.

FIG. 11 is a graph illustrating the transmittance, reflectance, and polarization degree of a polarizing layer, measured depending on the thickness of an anti-reflective layer, wherein the polarizing layer includes a wire grid polarizer disposed with a base metal layer and the anti-reflective layer. Here, the base layer of the wire grid polarizer includes aluminum having a thickness of 170 nm, and the anti-reflective layer includes MoTaOx.

Referring to FIG. 11, the polarizing layer applied to the display device may satisfy various optical properties. For example, to apply the polarizing layer to the display device, the polarizing layer may have a transmittance of 30% or more and a polarization degree of 99% or more. In particular, for the polarizing layer to prevent the reflection of incident light, the polarizing layer may have a reflectance of 5% or less.

The transmittance, reflectance, and polarization degree of the polarizing layer including the wire grid polarizer in association with the base metal layer and the anti-reflective layer are changed as the thickness of the anti-reflective layer is changed. For example, when the anti-reflective layer includes MoTaOx, the thickness of the anti-reflective layer that satisfies the optical properties of the polarizing layer ranges from 45 nm to 100 nm.

FIGS. 12 to 14 are graphs illustrating the transmittance, reflectance, and polarization degree of a polarizing layer including a wire grid polarizer, measured with respect to the thickness of a dielectric layer having silicon nitride. Here, the base layer of the wire grid polarizer includes aluminum having a thickness of 150 nm or 200 nm, and the anti-reflective layer of the wire grid polarizer includes tungsten, molybdenum, and/or titanium.

Referring to FIGS. 12 to 14, in the polarizing layer including the wire grid polarizer, the transmittance, reflectance, and polarization degree of the wire grid polarizer are changed to a lesser degree even when the thickness of the base layer is changed. However, as the thickness of the dielectric layer is changed, the transmittance, reflectance, and polarization degree of the polarizing layer are changed.

To apply the polarizing layer to the display device, the polarizing layer may have optical properties such as a transmittance of 30% or more, a reflectance of 5% or less, and/or a polarization degree of 99% or more.

In FIG. 12, when the anti-reflective layer includes tungsten (W), the thickness of the dielectric layer that satisfies the optical properties of the polarizing layer and that includes silicon nitride ranges from 20 nm to 70 nm. In FIG. 13, when the anti-reflective layer includes molybdenum (Mo), the thickness of the dielectric layer that satisfies the optical properties of the polarizing layer and that includes silicon nitride ranges from 40 nm to 85 nm. In FIG. 14, when the anti-reflective layer includes titanium (Ti), the thickness of the dielectric layer that satisfies the optical properties of the polarizing layer and that includes silicon nitride ranges from 45 nm to 80 nm.

Thus, the optimal thickness of the dielectric layer that satisfies the optical properties of the polarizing layer and that includes silicon nitride ranges from 45 nm to 70 nm.

FIGS. 15 to 17 are graphs illustrating the transmittance, reflectance, and polarization degree of a polarizing layer including a wire grid polarizer, measured depending on the thickness of a dielectric layer having silicon oxide. Here, the base layer of the polarizing layer includes aluminum having a thickness of 150 nm or 200 nm, and the anti-reflective layer of the polarizing layer includes tungsten, molybdenum, or titanium.

Referring to FIGS. 15 to 17, the transmittance, reflectance, and polarization degree of the polarizing layer including the wire grid polarizer are changed to a lesser extent even if the thickness of the base layer is changed. However, as the thickness of the dielectric layer is changed, the transmittance, reflectance, and polarization degree of the polarizing layer are changed.

To apply the polarizing layer to the display device, the polarizing layer may have optical properties such as a transmittance of 30% or more, a reflectance of 5% or less, and a polarization degree of 99% or more.

In FIG. 15, when the anti-reflective layer includes titanium (Ti), the thickness of the dielectric layer that satisfies the optical properties of the polarizing layer and that includes silicon oxide ranges from 60 nm to 90 nm. In FIG. 16, when the anti-reflective layer includes molybdenum (Mo), the thickness of the dielectric layer that satisfies the optical properties of the polarizing layer and that includes silicon oxide ranges from 50 nm to 100 nm. In FIG. 17, when the anti-reflective layer includes tungsten (W), the thickness of the dielectric layer that satisfies the optical properties of the polarizing layer and that includes silicon oxide ranges from 20 nm to 70 nm.

Thus, the optimal thickness of the dielectric layer that satisfies the optical properties of the polarizing layer and that includes silicon oxide ranges from 60 nm to 90 nm.

FIGS. 18 to 23 are simulation graphs illustrating the transmittance, reflectance, and polarization degree of a polarizing layer including a wire grid polarizer, measured depending on the thickness of an anti-reflective layer having a low-reflection metal. Here, the base layer of the polarizing layer includes aluminum having a thickness of 150 nm, and the dielectric layer of the polarizing layer includes silicon oxide or silicon nitride.

Referring to FIGS. 18 to 23, in the polarizing layer including the wire grid polarizer, the transmittance, reflectance, and polarization degree of the wire grid polarizer are changed to a lesser extent even if the material of the dielectric layer is changed. However, the transmittance, reflectance, and polarization degree of the polarizing layer are changed depending on the material of the anti-reflective layer.

To apply the polarizing layer to the display device, the polarizing layer may have optical properties such as a transmittance of 30% or more, a reflectance of 5% or less, and a polarization degree of 99% or more.

Figure 18:
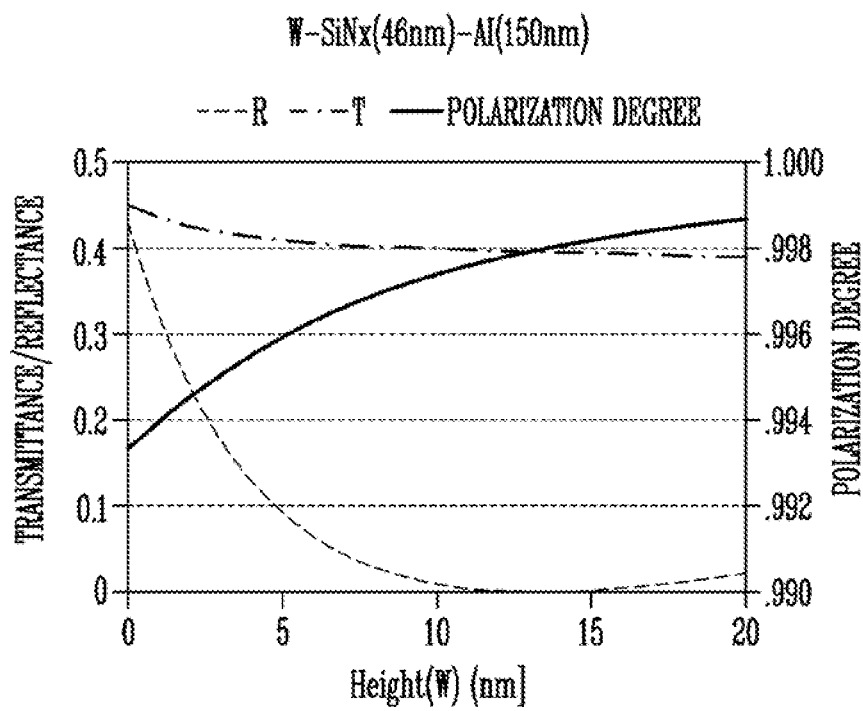
FIGS. 18 to 23 are graphs illustrating the transmittance, reflectance, and polarization degree of a polarizing layer including a wire grid polarizer, measured with respect to the thickness of an anti-reflective layer that includes a low-reflection metal.
Figure 19:
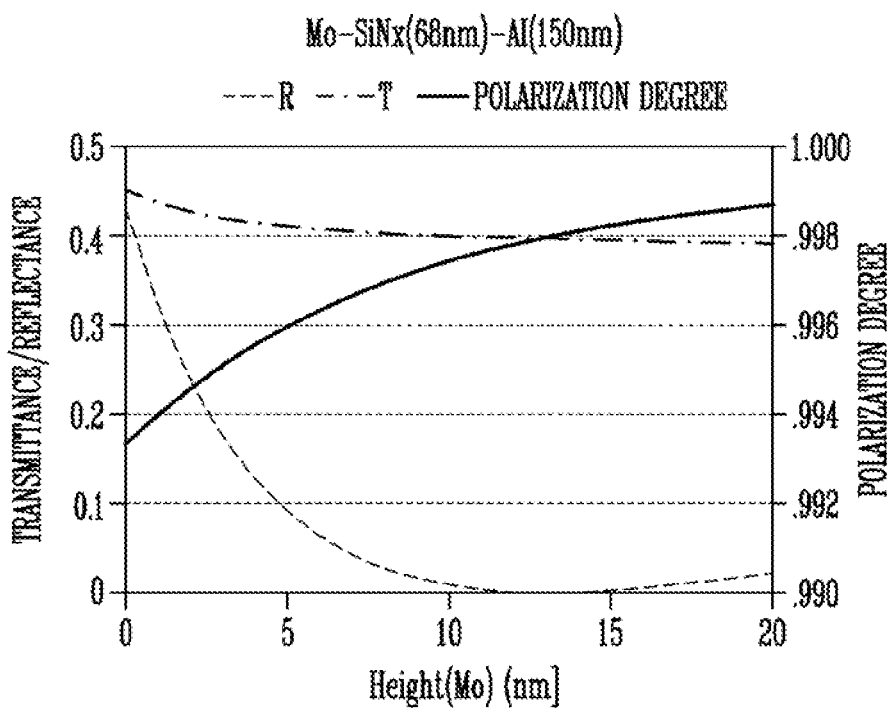
Figure 20:
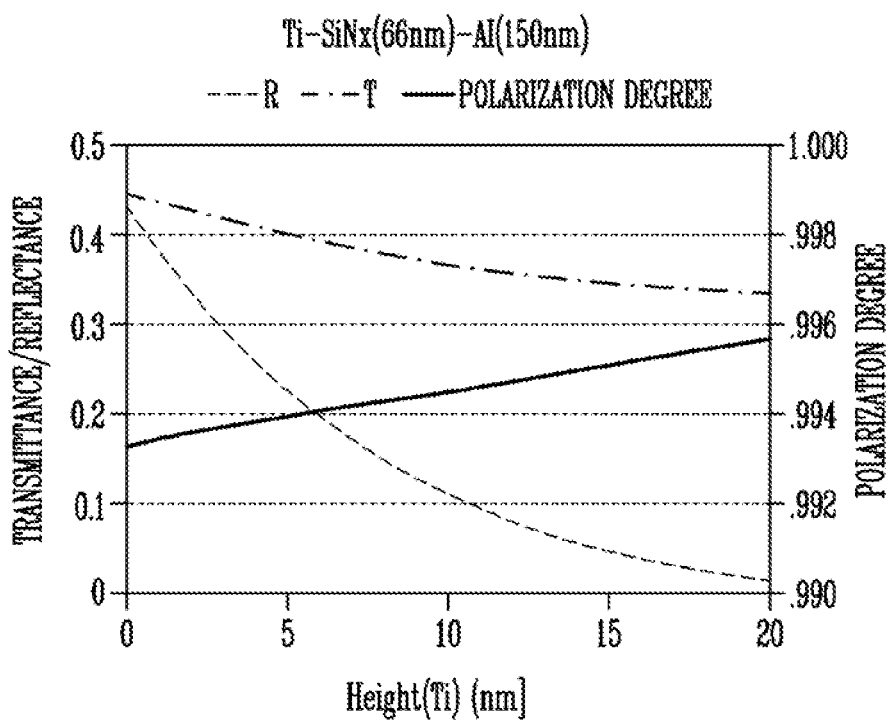
Figure 21:
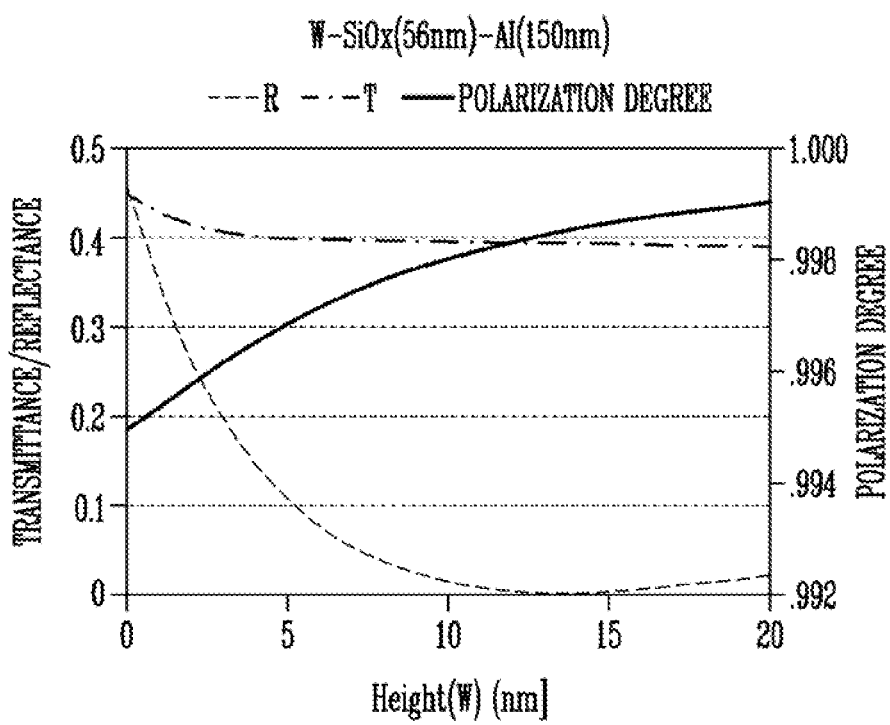
Figure 22:
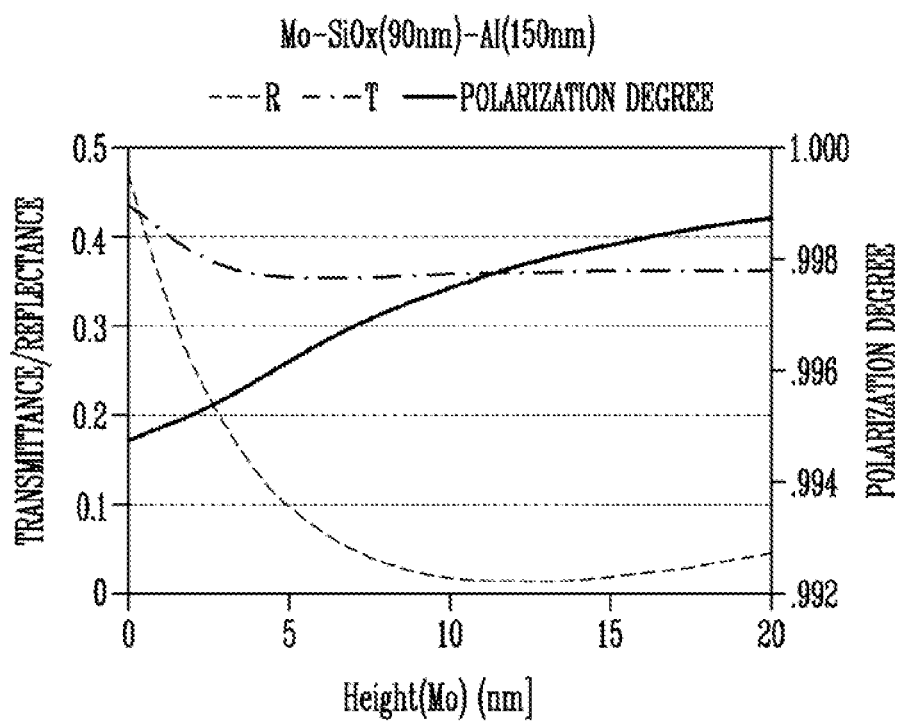
Figure 23:
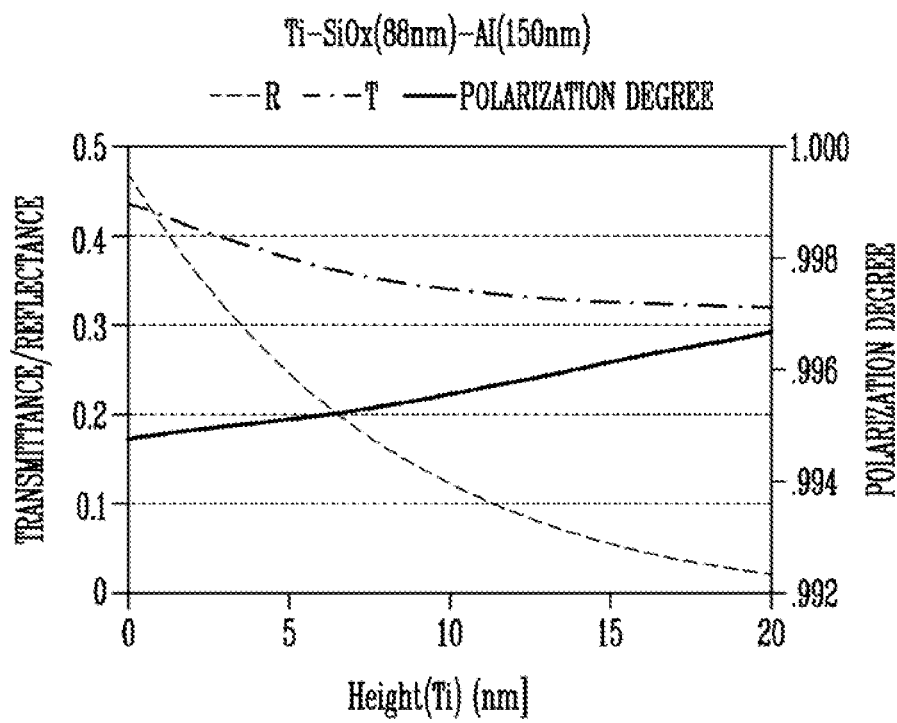

In FIGS. 18 and 21, the thickness of the anti-reflective layer that satisfies the optical properties of the polarizing layer and that includes tungsten (W) ranges from 7 nm to 40 nm. In FIGS. 19 and 22, the thickness of the anti-reflective layer that satisfies the optical properties of the polarizing layer and that includes molybdenum (Mo) ranges from 7 nm to 40 nm. In FIGS. 20 and 23, the thickness of the anti-reflective layer that satisfies the optical properties of the polarizing layer and that includes titanium (Ti) ranges from 12 nm to 40 nm.

Thus, the optimal thickness of the anti-reflective layer that satisfies optical properties of the polarizing layer and that includes tungsten (W), molybdenum (Mo), and/or titanium (Ti) ranges from 12 nm to 40 nm.

Figure 24:
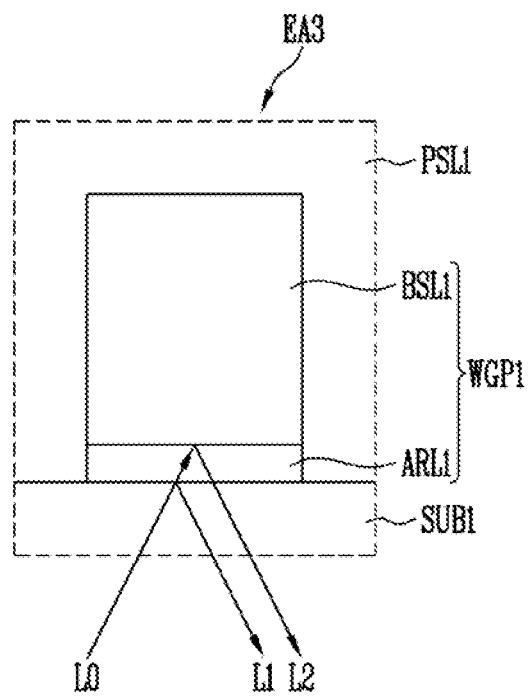
FIGS. 24 to 27 are diagrams illustrating a polarizing layer of a display device according to an exemplary embodiment of the present disclosure.
Figure 25:
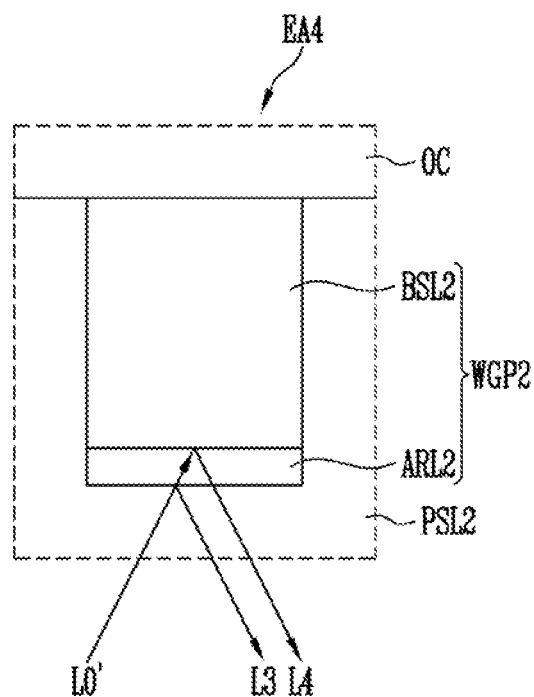
Figure 26:
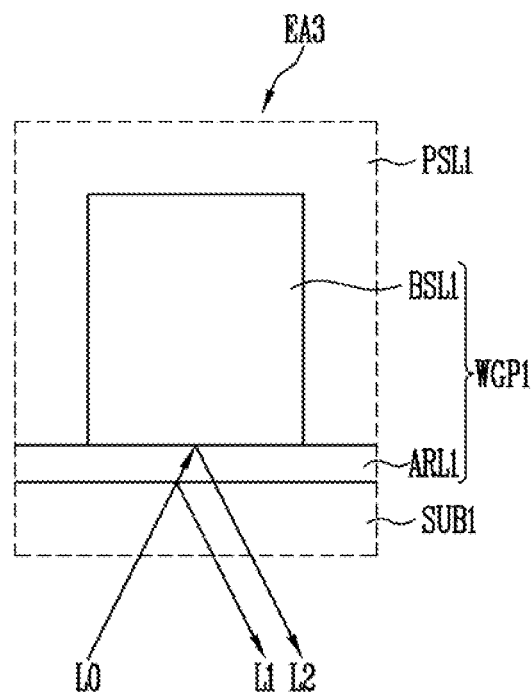
Figure 27:
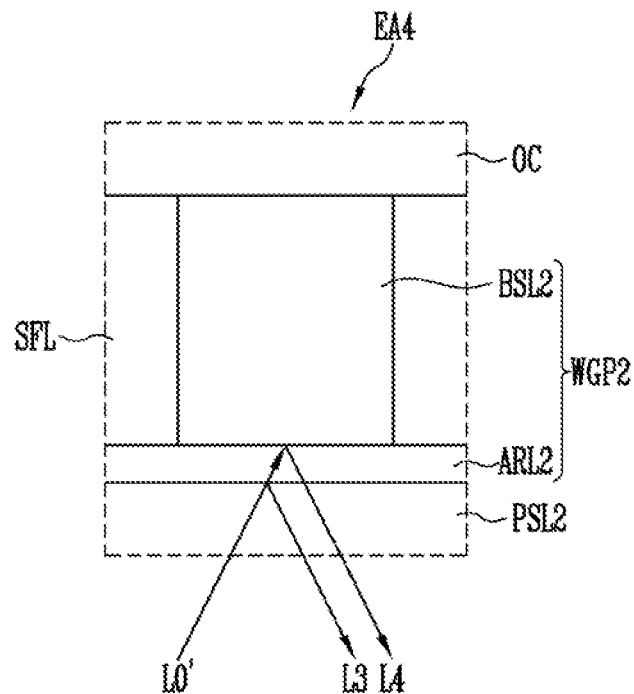

FIGS. 24 to 27 are diagrams illustrating a polarizing layer of a display device according to an exemplary embodiment of the present disclosure, wherein FIGS. 24 and 26 are enlarged views of region EA3 of FIG. 7, and FIGS. 25 and 27 are enlarged views of region EA4 of FIG. 8.

Referring to FIGS. 5 to 8 and FIGS. 24 to 27, a first polarizing layer Pol1 may include a plurality of first wires WGP1 disposed between a first base substrate SUB1 and a first passivation layer PSL1. Each of the first wires WGP1 may include a first base layer BSL1 and a first anti-reflective layer ARL1.

The first base layer BSL1 may be disposed on the first base substrate SUB1 and may include aluminum (Al) or an aluminum alloy (Al alloy). The thickness of the first base layer BSL1 may be 140 nm to 220 nm.

The first anti-reflective layer ARL1 may be disposed between the first base substrate SUB1 and the first base layer BSL1, and may include a material, the refractive index η of which ranges from 1.3 to 3.5 and the absorption coefficient c of which ranges from 0.3 to 4.0 within a wavelength range of 250 nm to 550 nm. The thickness of the first anti-reflective layer ARL1 may be 12 nm to 40 nm. Further, as illustrated in FIG. 26, the first anti-reflective layer ARL1 of one of the first wires WGP1 may be connected to the first anti-reflective layers ARL1 of adjacent first wires WGP1.

The first polarizing layer Pol1 including the first wires WGP1 may polarize or extinguish first incident light L0 depending on the direction in which the first incident light L0 vibrates. For example, the first polarizing layer Pol1 may transmit P-polarized light of the first incident light L0. Part of S-polarized light may be absorbed in or reflected from the first anti-reflective layer ARL1, and the remaining part of the S-polarized light may pass through the first anti-reflective layer ARL1 and may be reflected from the first base layer BSL1. First reflected light L1 reflected from the first anti-reflective layer ARL1 and second reflected light L2 reflected from the first base layer BSL1 may satisfy destructive interference conditions. For example, part of the S-polarized light may be absorbed and extinguished in the first anti-reflective layer ARL1, and the remaining part of the S-polarized light may be extinguished depending on the destructive interference conditions.

A second polarizing layer Pol2 may include a plurality of second wires WGP2 disposed between a color representation layer CRL and a second passivation layer PSL2 of a second driving layer DDL2. Each of the second wires WGP2 may include a second base layer BSL2 and a second anti-reflective layer ARL2.

The second base layer BSL2 may be disposed between the color representation layer CRL and the passivation layer PSL2. The second base layer BSL2 may include the same material as the first base layer BSL1. Further, the thickness of the second base layer BSL2 may have the same range as the thickness of the first base layer BSL1.

The second anti-reflective layer ARL2 may be disposed between the second base layer BSL2 and the second passivation layer PSL2. The second anti-reflective layer ARL2 may include the same material as the first anti-reflective layer ARL1. Furthermore, the thickness of the second anti-reflective layer ARL2 may have the same range as the thickness of the first anti-reflective layer ARL1.

Further, as illustrated in FIG. 27, the second anti-reflective layer ARL2 of one of the second wires WGP2 may be connected to the second anti-reflective layers ARL2 of adjacent second wires WGP2. Here, when the second anti-reflective layer ARL2 of one of the second wires WGP2 is connected to the second anti-reflective layers ARL2 of adjacent second wires WGP2, a cavity may be formed below the second anti-reflective layer ARL2 between the adjacent second wires WGP2. The cavity may be filled with a filling layer SFL containing an insulating material. The filling layer SFL may include a material, the refractive index η of which ranges from 1 to 1.4.

The filling layer SFL may fill the cavity, thus maintaining intervals between the second wires WGP2. Further, the filling layer SFL may prevent the second wires WGP2 from being damaged by an external impact applied to the display panel 100.

The second polarizing layer Pol2 including the second wires WGP2 may polarize or extinguish second incident light L0' depending on the direction in which the second incident light L0' vibrates. For example, the second polarizing layer Pol2 may transmit P-polarized light of the second incident light L0'. Part of S-polarized light may be absorbed in or reflected from the second anti-reflective layer ARL2, and the remaining part of the S-polarized light may pass through the second anti-reflective layer ARL2 and may be reflected from the second base layer BSL2. Third reflected light L3 reflected from the second anti-reflective layer ARL2 and fourth reflected light L4 reflected from the second base layer BSL2 may satisfy destructive interference conditions, thereby being extinguished. For example, part of the S-polarized light may be absorbed and extinguished in the second anti-reflective layer ARL2, and the remaining part of the S-polarized light may be extinguished depending on the destructive interference conditions.

Figure 28:
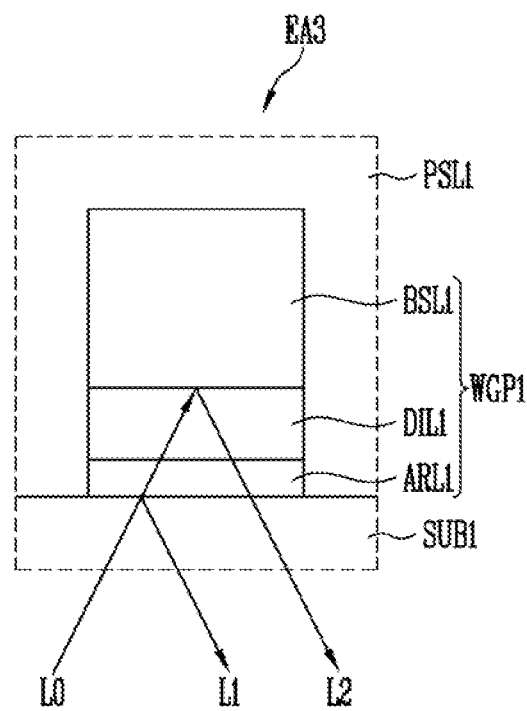
FIGS. 28 to 33 are diagrams illustrating a polarizing layer of a display device according to an exemplary embodiment of the present disclosure.
Figure 29:
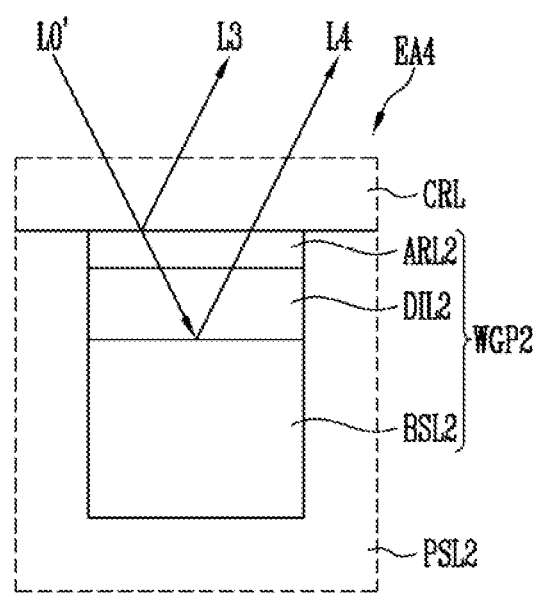
Figure 30:
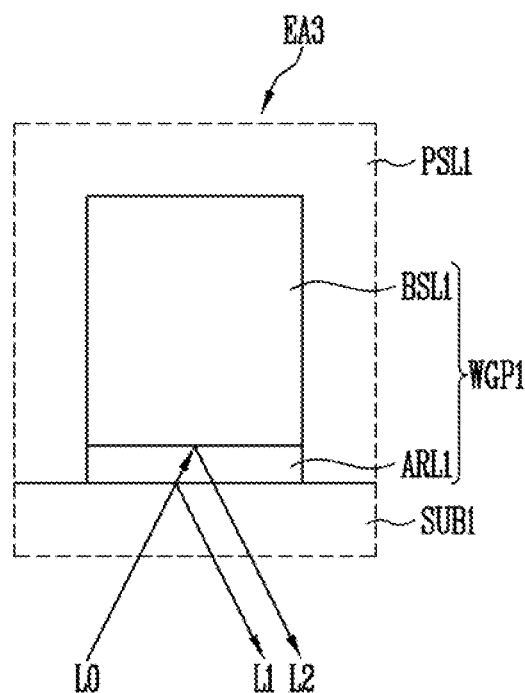
Figure 31:
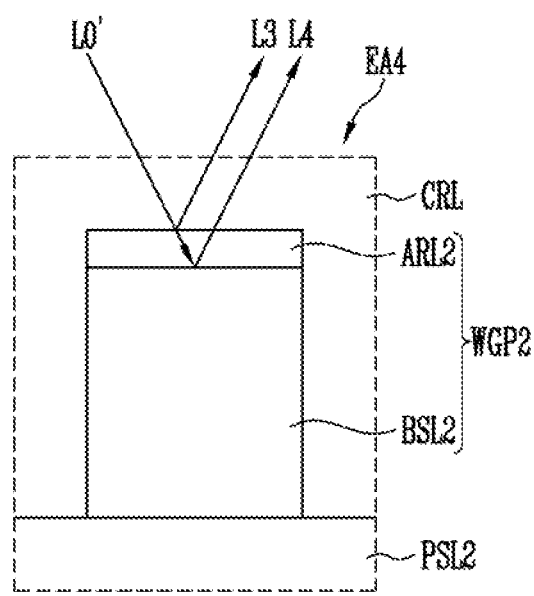
Figure 32:
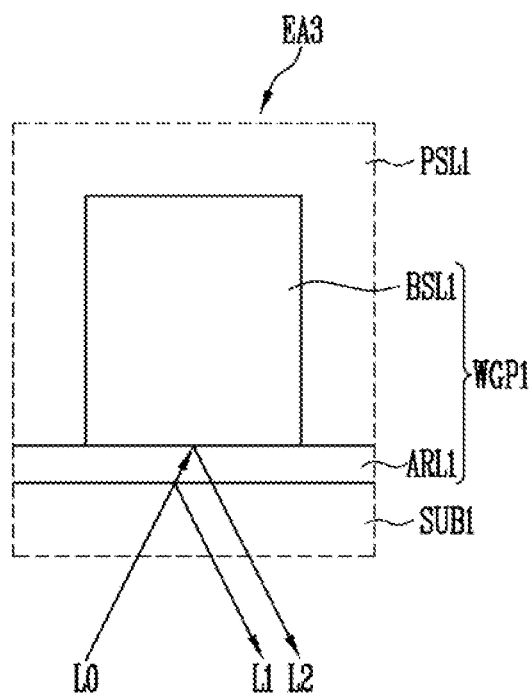
Figure 33:
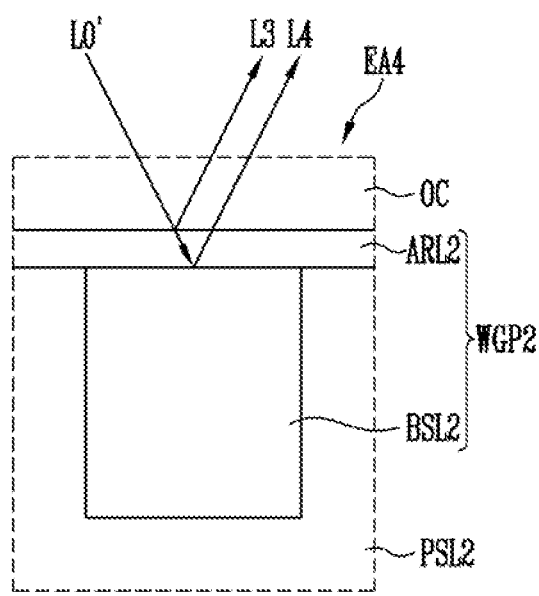

FIGS. 28 to 33 are diagrams illustrating a polarizing layer of a display device according to an exemplary embodiment of the present disclosure, wherein FIGS. 28, 30, and 32 are enlarged views of region EA3 of FIG. 7, and FIGS. 29, 31, and 33 are enlarged views of region EA4 of FIG. 8.

Referring to FIGS. 28 to 33, a first polarizing layer Pol1 may include a plurality of first wires WGP1 disposed between a first base substrate SUB1 and a first passivation layer PSL1. Each of the first wires WGP1 may include a first base layer BSL1 and a first anti-reflective layer ARL1.

The first base layer BSL1 may be disposed on the first base substrate SUB1 and may include aluminum (Al) or an aluminum alloy (Al alloy). The thickness of the first base layer BSL1 may be 140 nm to 220 nm.

The first anti-reflective layer ARL1 may be disposed between the first base substrate SUB1 and the first base layer BSL1, and may include a material, the refractive index η of which ranges from 1.3 to 3.5 and the absorption coefficient κ of which ranges from 0.3 to 4.0 within a wavelength range of 250 nm to 550 nm. The thickness of the first anti-reflective layer ARL1 may be 12 nm to 40 nm.

Each of the first wires WGP1 may further include a first dielectric layer DIL1 disposed between the first base layer BSL1 and the first anti-reflective layer ARL1. The first dielectric layer DIL1 may include a transparent dielectric material, the refractive index η of which ranges from 1.3 to 2.2 and the absorption coefficient κ of which ranges from 0 to 0.5. The thickness of the first dielectric layer DIL1 may be 0 nm to 100 nm.

The first polarizing layer Pol1 may transmit P-polarized light of first incident light L0. Here, the first incident light L0 may be light supplied from the backlight unit 200.

Part of S-polarized light may be absorbed in or reflected from the first anti-reflective layer ARL1, and the remaining part of the S-polarized light may pass through the first anti-reflective layer ARL1 and may be reflected from the first base layer BSL1. First reflected light L1 reflected from the first anti-reflective layer ARL1 and second reflected light L2 reflected from the first base layer BSL1 may satisfy destructive interference conditions depending on the thickness of the first dielectric layer DIL1. For example, part of the S-polarized light may be absorbed and extinguished in the first anti-reflective layer ARL1, and the remaining part of the S-polarized light may be extinguished depending on the destructive interference conditions. Therefore, the first polarizing layer Pol1 may prevent the leakage of light from occurring due to the S-polarized light of the first incident light L0 that is supplied from the backlight unit 200.

A second polarizing layer Pol2 may include a plurality of second wires WGP2 disposed between a color representation layer CRL and a second passivation layer PSL2 of a second driving layer DDL2. Each of the second wires WGP2 may include a second base layer BSL2 and a second anti-reflective layer ARL2.

The second base layer BSL2 may be disposed between the color representation layer CRL and the second passivation layer PSL2. The second base layer BSL2 may include the same material as the first base layer BSL1. Further, the thickness of the second base layer BSL2 may have the same range as the thickness of the first base layer BSL1.

The second anti-reflective layer ARL2 may be disposed between the second base layer BSL2 and the color representation layer CRL. For example, the second anti-reflective layer ARL2 may be disposed adjacent to the second base substrate SUB2. The second anti-reflective layer ARL2 may include the same material as the first anti-reflective layer ARL1. Furthermore, the thickness of the second anti-reflective layer ARL2 may have the same range as the thickness of the first anti-reflective layer ARL1.

Each of the second wires WGP2 may further include a second dielectric layer DIL2 disposed between the second base layer BSL2 and the second anti-reflective layer ARL2. The second dielectric layer DIL2 may include the same material as the first dielectric layer DIL1. Further, the thickness of the second dielectric layer DIL2 may have the same range as the thickness of the first dielectric layer DIL1.

The second polarizing layer Pol2 may prevent the reflection of external light because the second anti-reflective layer ARL2 is disposed adjacent to the second base substrate SUB2.

The second polarizing layer Pol2 may extinguish second incident light L0' that is incident on the second polarizing layer Pol2. Here, the second incident light L0' may be the external light.

The second polarizing layer Pol2 may transmit P-polarized light of the second incident light L0', and the transmitted P-polarized light may be absorbed and extinguished in the liquid crystal layer LCL.

Part of S-polarized light may be absorbed in or reflected from the second anti-reflective layer ARL2, and the remaining part of the S-polarized light may pass through the second anti-reflective layer ARL2 and may be reflected from the second base layer BSL2. Third reflected light L3 reflected from the second anti-reflective layer ARL2 and fourth reflected light L4 reflected from the second base layer BSL2 may be extinguished by destructive interference. Therefore, the second polarizing layer Pol2 may prevent the external light from being reflected from the display panel 100.

Figure 34:
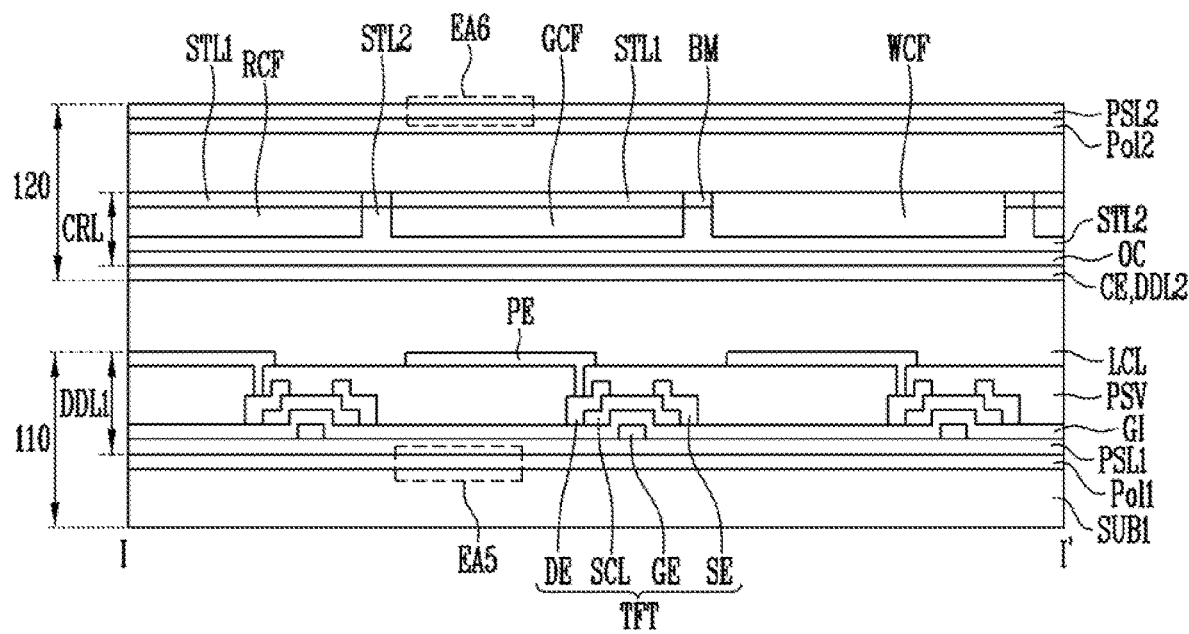
FIG. 34 is a cross-sectional view illustrating a display panel of a display device according to an exemplary embodiment of the present disclosure.
Figure 35:
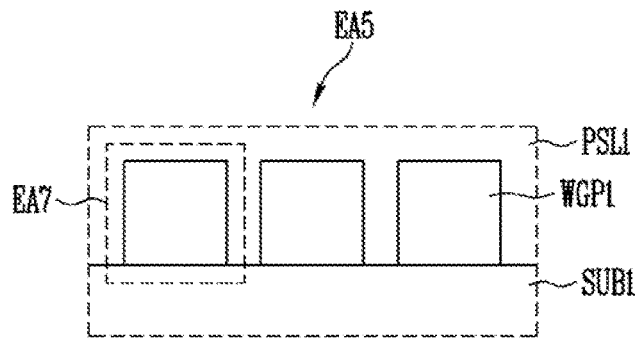
FIG. 35 is an enlarged view of region EA5 of FIG. 34.
Figure 36:
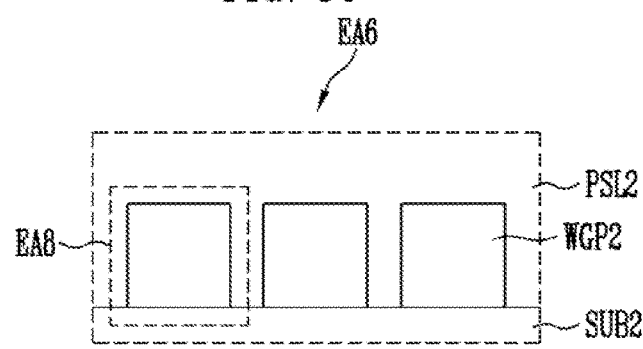
FIG. 36 is an enlarged view of region EA6 of FIG. 34.
Figure 37:
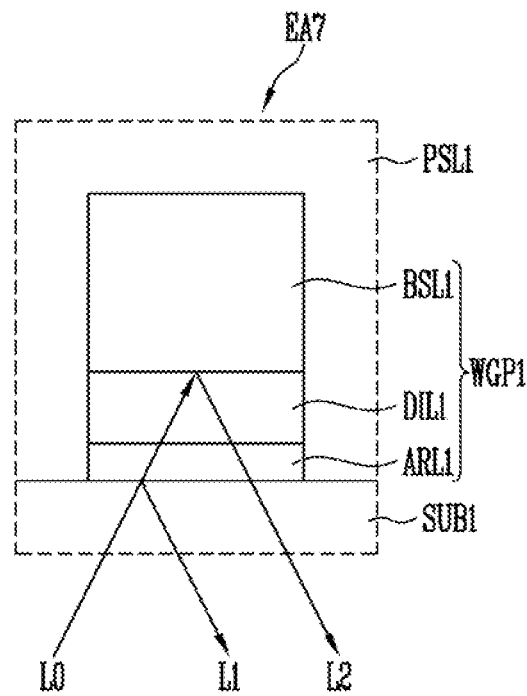
FIGS. 37, 39, and 41 are enlarged views of region EA7 of FIG. 35.
Figure 38:
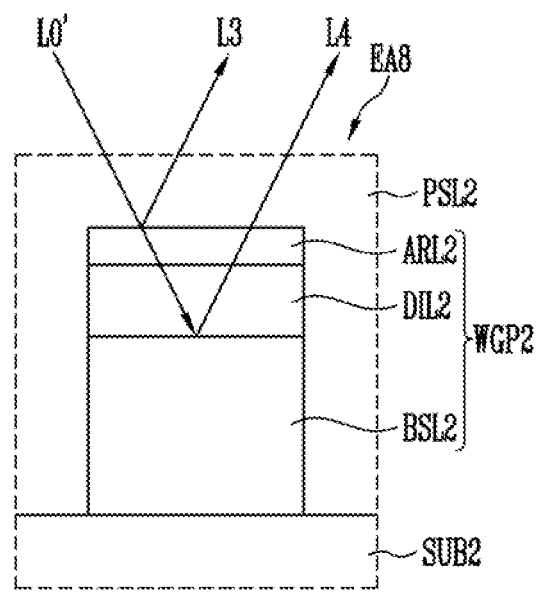
FIGS. 38, 40, and 42 are enlarged views of region EA8 of FIG. 35.
Figure 39:
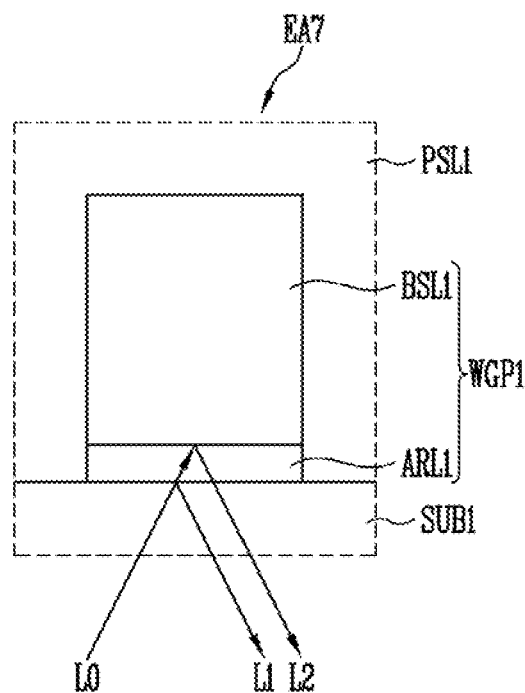
Figure 40:
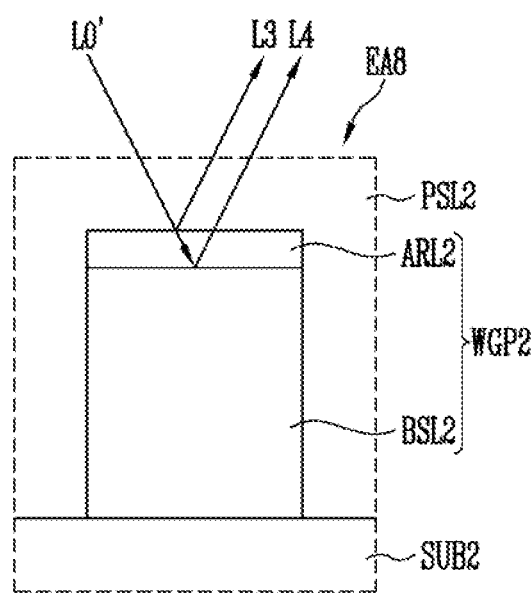
Figure 41:
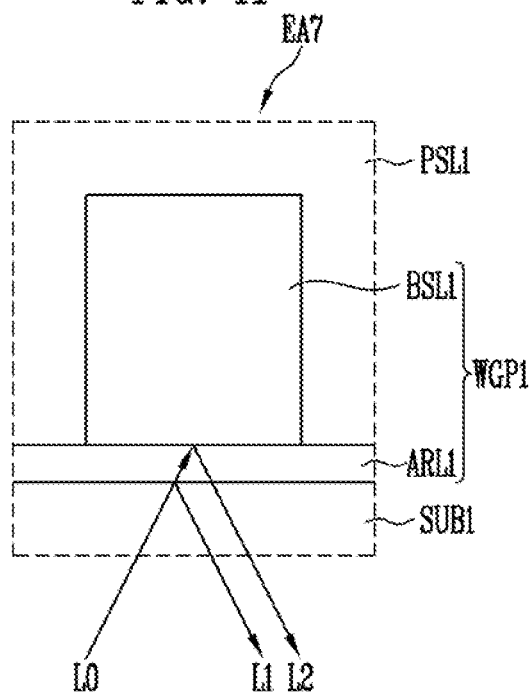

FIG. 34 is a cross-sectional view illustrating a display panel of a display device according to an exemplary embodiment of the present disclosure, FIG. 35 is an enlarged view of region EA5 of FIG. 34, FIG. 36 is an enlarged view of region EA6 of FIG. 34, FIGS. 37, 39, and 41 are enlarged views of region EA7 of FIG. 35, and FIGS. 38, 40, and 42 are enlarged views of region EA8 of FIG. 36.

Referring to FIGS. 1 to 5 and FIGS. 34 to 42, the display panel 100 may include a red pixel RPXL, a green pixel GPXL, and a blue pixel BPXL. Further, the display panel 100 may include a first substrate 110, a second substrate 120, and a liquid crystal layer LCL.

The first substrate 110 may include a first base substrate SUB1, a first polarizing layer Pol1, and a first driving layer DDL1.

The first polarizing layer Pol1 may include a plurality of first wires WGP1 disposed between the first base substrate SUB1 and the first driving layer DDL. Each of the first wires WGP1 may include a first base layer BSL1 and a first anti-reflective layer ARL1.

The first base layer BSL1 may be disposed between the first base substrate SUB1 and the first driving layer DDL1, and may include aluminum (Al) or an aluminum alloy (Al alloy). The thickness of the first base layer BSL1 may be 140 nm to 220 nm.

The first anti-reflective layer ARL1 may be disposed between the first base substrate SUB1 and the first base layer BSL1, and may include tungsten (W), molybdenum (Mo) titanium (Ti), and/or an alloy of these materials. The first anti-reflective layer ARL1 may include a material, the refractive index $\eta$ of which ranges from 1.3 to 3.5 and the absorption coefficient c of which ranges from 0.3 to 4.0 within a wavelength range of 250 nm to 550 nm. The thickness of the first anti-reflective layer ARL1 may be 12 nm to 40 nm.

Each of the first wires WGP1 may further include a first dielectric layer DIL1 disposed between the first base layer BSL1 and the first anti-reflective layer ARL1. The thickness of the first dielectric layer DIL1 may be 0 nm to 100 nm.

The first polarizing layer Pol1 may transmit P-polarized light of the first incident light L0. Here, the first incident light L0 may be light supplied from the backlight unit 200.

Further, part of S-polarized light may be absorbed in or reflected from the first anti-reflective layer ARL1. The remaining part of the S-polarized light may pass through the first anti-reflective layer ARL1 and may be reflected from the first base layer BSL1. First reflected light L1 reflected from the first anti-reflective layer ARL1 and second reflected light L2 reflected from the first base layer BSL1 may be extinguished by destructive interference. Therefore, the first polarizing layer Pol1 may prevent the leakage of light from occurring due to the S-polarized light of the first incident light L0 that is supplied from the backlight unit 200.

The second substrate 120 may be an opposite substrate that faces the first substrate 110. The second substrate 120 may include a second base substrate SUB2, a color representation layer CRL, a second driving layer DDL2, and a second polarizing layer Pol2.

The color representation layer CRL may be disposed on a first surface of the second base substrate SUB2, for example, on a surface facing the first substrate 110.

The second driving layer DDL2 may be disposed on the color representation layer CRL and may include a common electrode CE.

The second polarizing layer Pol2 may be disposed on a second surface of the second base substrate SUB2, for example, on an outer surface of the second base substrate SUB2.

The second polarizing layer Pol2 may include a plurality of second wires WGP2 disposed on the second surface of the second base substrate SUB2. Each of the second wires WGP2 may include a second base layer BSL2 and a second anti-reflective layer ARL2.

The second base layer BSL2 may be disposed on the second surface of the second base substrate SUB2. The second base layer BSL2 may include the same material as the first base layer BSL1.

The second anti-reflective layer ARL2 may be disposed on the second base layer BSL2. The second anti-reflective layer ARL2 may include the same material as the first anti-reflective layer ARL1. Furthermore, the thickness of the second anti-reflective layer ARL2 may have the same range as the thickness of the first anti-reflective layer ARL1.

Figure 42:
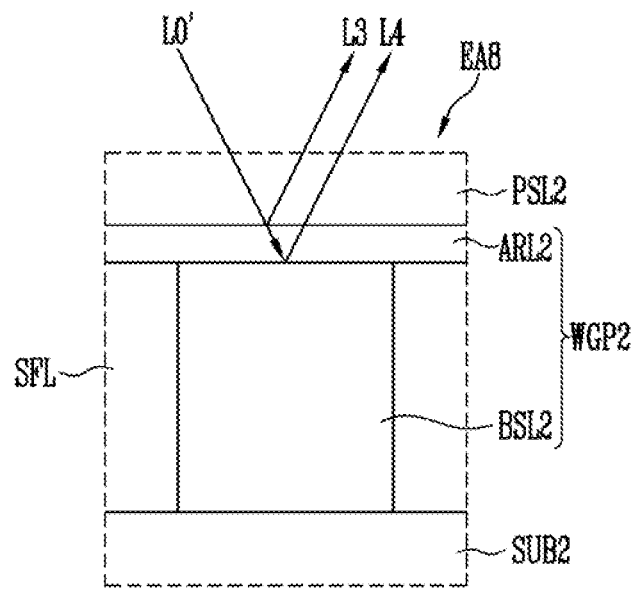

Further, as illustrated in FIG. 42, the second anti-reflective layer ARL2 of one of the second wires WGP2 may be connected to the second anti-reflective layers ARL2 of adjacent second wires WGP2. Here, when the second anti-reflective layer ARL2 of one of the second wires WGP2 is connected to the second anti-reflective layers ARL2 of adjacent second wires WGP2, a cavity may be formed below the second anti-reflective layer ARL2 between the adjacent second wires WGP2. The cavity may be filled with a filling layer SFL containing an insulating material. The filling layer SFL may include a material, the refractive index r1 of which ranges from 1 to 1.4.

Each of the second wires WGP2 may further include a second dielectric layer DIL2 disposed between the second base layer BSL2 and the second anti-reflective layer ARL2. The second dielectric layer DIL2 may include the same material as the first dielectric layer DIL1. Further, the thickness of the second dielectric layer DIL2 may have the same range as the thickness of the first dielectric layer DIL1.

The second polarizing layer Pol2 may transmit P-polarized light of second incident light L0', and the transmitted P-polarized light may be absorbed and extinguished in the liquid crystal layer LCL. Here, the second incident light L0' may be the external light.

Part of the S-polarized light may be absorbed in or reflected from the second anti-reflective layer ARL2. The remaining part of the S-polarized light may pass through the second anti-reflective layer ARL2, and may be reflected from the second base layer BSL2. Third reflected light L3 reflected from the second anti-reflective layer ARL2 and fourth reflected light L4 reflected from the second base layer BSL2 may be extinguished by destructive interference. Therefore, the second polarizing layer Pol2 may prevent the external light from being reflected from the display panel 100.

The second substrate 120 may further include a second passivation layer PSL2 disposed on the second polarizing layer Pol2. The second passivation layer PSL2 may at least partially cover the second wires WGP2 and may fill spaces between adjacent second wires WGP2. Therefore, the second passivation layer PSL2 may planarize the surface of the second polarizing layer Pol2. The second passivation layer PSL2 may include a material, the refractive index $\eta$ of which ranges from 1 to 1.4.

Figure 43:
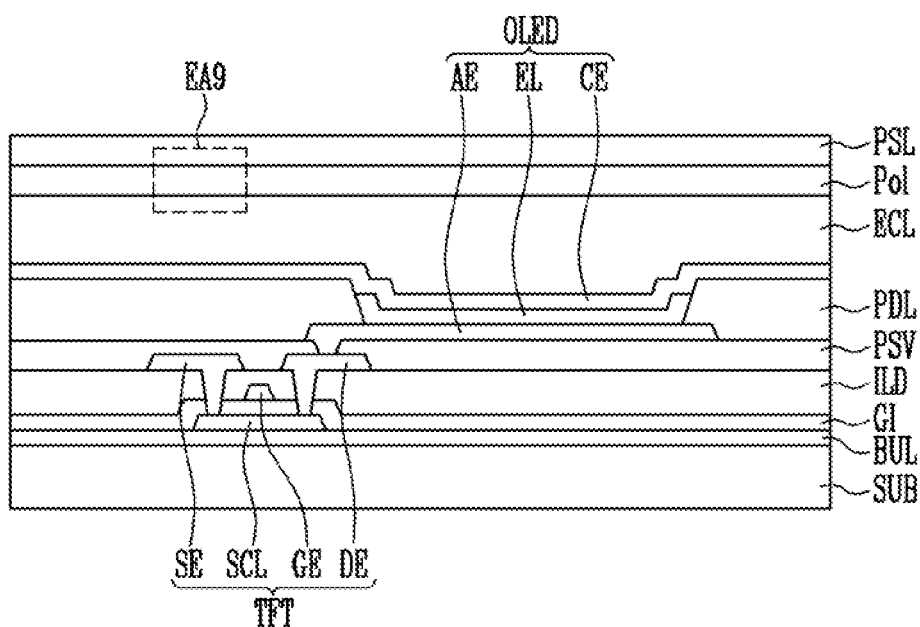
FIG. 43 is a cross-sectional view illustrating a display panel of a display device according to an exemplary embodiment of the present disclosure.
Figure 44:
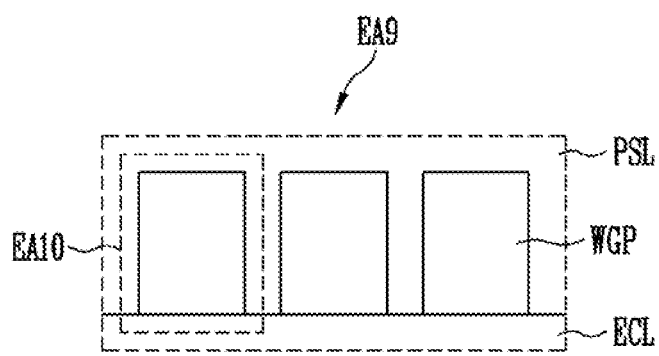
FIG. 44 is an enlarged view of region EA9 of FIG. 43.
Figure 45:
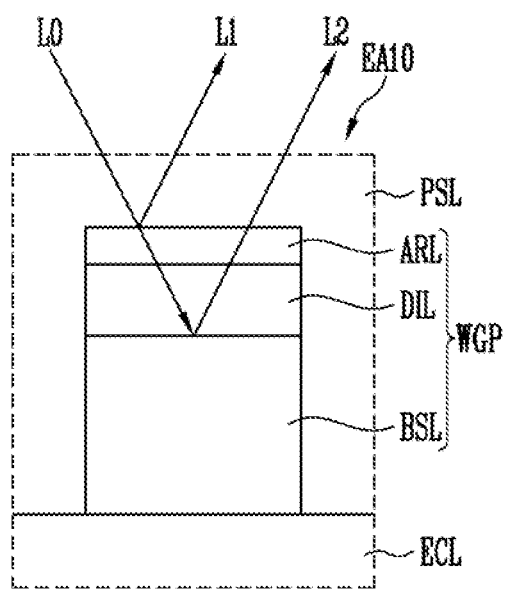
FIG. 45 is an enlarged view of region EA10 of FIG. 44.

FIG. 43 is a cross-sectional view illustrating a display panel of a display device according to an exemplary embodiment of the present disclosure, FIG. 44 is an enlarged view of region EA9 of FIG. 43, and FIG. 45 is an enlarged view of region EA10 of FIG. 44.

Referring to FIGS. 43 to 45, the display panel 100 may include a base substrate SUB, a thin film transistor TFT disposed on the base substrate SUB, a light-emitting element OLED coupled to the thin film transistor TFT, an encapsulating layer ECL covering the light-emitting element OLED, and a polarizing layer Pol disposed on the encapsulating layer ECL.

The base substrate SUB may include a transparent insulating material, thus allowing light to pass therethrough. Also, the base substrate SUB may be a rigid substrate or a flexible substrate.

A buffer layer BUL may be disposed between the base substrate SUB and the thin film transistor TFT. The buffer layer BUL may include an inorganic insulating material. For example, the buffer layer BUL may include silicon oxide, silicon nitride, and/or silicon oxynitride. Further, the buffer layer BUL may have a single-layer structure or a multilayer structure. For example, the buffer layer BUL may have a single-layer structure including any one of silicon oxide, silicon nitride, and silicon oxynitride. The buffer layer BUL may include a silicon oxide layer, and a silicon nitride layer disposed on the silicon oxide layer. The buffer layer BUL may include three or more insulating layers that are sequentially stacked.

The buffer layer BUL may prevent impurities from diffusing from the base substrate SUB into the thin film transistor TFT. Furthermore, the buffer layer BUL may planarize the surface of the base substrate SUB.

The thin film transistor TFT may be coupled to a gate line and a data line. The thin film transistor TFT may include a semiconductor layer SCL, a gate electrode GE, a source electrode SE, and a drain electrode DE.

The semiconductor layer SCL may be disposed on the buffer layer BUL. The semiconductor layer SCL may include amorphous silicon (a-Si), poly crystalline silicon (p-Si), an oxide semiconductor, and/or an organic semiconductor. On the semiconductor layer SCL, a region coupled to the source electrode SE and a region coupled to the drain electrode DE may be a source region and a drain region with or into which impurities have been doped or injected. An area between the source region and the drain region may be a channel area.

Although not illustrated in the drawings, if the semiconductor layer SCL includes an oxide semiconductor, a light-blocking layer may be disposed on or under the semiconductor layer SCL so as to block light from being incident on the semiconductor layer SCL.

A gate insulating layer GI may be disposed on the semiconductor layer SCL. The gate insulating layer GI may at least partially cover the semiconductor layer SCL and may insulate the semiconductor layer SCL and the gate electrode GE from each other.

The gate electrode GE may be disposed on the gate insulating layer GI. The gate electrode GE may be coupled to the gate line. The gate electrode GE may at least partially overlap the semiconductor layer SCL.

An interlayer insulating layer ILD may be disposed on the gate electrode GE. The interlayer insulating layer ILD may include an organic insulating material and/or an inorganic insulating material. The interlayer insulating layer ILD may insulate the source electrode SE, the drain electrode DE, and the gate electrode GE from each other.

Contact holes which are formed through the gate insulating layer GI and the interlayer insulating layer ILD may expose the source region and the drain region of the semiconductor layer SCL.

The source electrode SE and the drain electrode DE may be disposed on the interlayer insulating layer ILD and may be spaced apart from each other. A first end of the source electrode SE may be coupled to the data line. A second end of the source electrode SE may be coupled to the source region through one of the contact holes. A first end of the drain electrode DE may be coupled to the drain region through another one of the contact holes. A second end of the drain electrode DE may be coupled to the light-emitting element OLED.

A protective layer PSV may be disposed on the thin film transistor TFT. The protective layer PSV may at least partially cover the thin film transistor TFT. A portion of the protective layer PSV is removed to expose one of the source electrode SE and the drain electrode DE, for example, the drain electrode DE.

The light-emitting element OLED may be disposed on the protective layer PSV and may be connected to the drain electrode DE.

The light-emitting element OLED may include a first electrode AE connected to the drain electrode DE, a light-emitting layer EL disposed on the first electrode AE, and a second electrode CE disposed on the light-emitting layer EL.

One of the first electrode AE and the second electrode CE may be an anode electrode, and the other may be a cathode electrode. For example, the first electrode AE may be an anode electrode, and the second electrode CE may be a cathode electrode.

The first electrode AE may be disposed on the protective layer PSV. The first electrode AE may include a reflective layer which is capable of reflecting light, and a transparent conductive layer which is disposed on or under the reflective layer. The transparent conductive layer and/or the reflective layer may be connected to the drain electrode DE.

A pixel defining layer PDL may be disposed on the first electrode AE. The pixel defining layer PDL may expose the first electrode AE.

The light-emitting layer EL may be disposed on the exposed surface of the first electrode AE. The light-emitting layer EL may have a multilayer thin-film structure including at least a light generation layer LGL. For example, the light-emitting layer EL may include a hole injection layer (HIL) into which holes are injected. A hole transport layer (HTL) may be used to aid the movement of holes into the light generation layer. The hole transport layer may have excellent hole transportation performance and may restrain movement of electrons that have not been combined with holes in the light generation layer and thus increases chances of recombination of holes and electrons. The light generation layer emits light by recombination of injected electrons and holes. A hole blocking layer (HBL) restrains movement of holes that have not been combined with electrons in the light generation layer. An electron transport layer (ETL) is provided to smoothly transport electrons to the light generation layer. An electron injection layer (EIL) injects electrons.

The color of light generated from the light generation layer may be red, green, blue or white, but the present invention is not limited thereto. For example, the color of light generated from the light generation layer may be magenta, cyan or yellow.

The hole injection layer, the hole transport layer, the hole blocking layer, the electron transport layer, and the electron injection layer may be common layers coupled between adjacent pixel areas.

The second electrode CE may be disposed on the light-emitting layer EL. The second electrode CE may include a material having a work function lower than that of the transparent conductive layer.

The encapsulating layer ECL may be disposed on the second electrode CE. The encapsulating layer ECL may at least partially cover the light-emitting element OLED and may prevent oxygen or water from permeating the light-emitting element OLED. The encapsulating layer ECL may include a plurality of insulating layers. For example, the encapsulating layer ECL may include a plurality of inorganic layers and a plurality of organic layers. In addition, the encapsulating layer ECL may include a plurality of encapsulating units, each including an inorganic layer and an organic layer disposed on the inorganic layer.

The polarizing layer Pol may be disposed on the encapsulating layer ECL. The polarizing layer Pol may include a plurality of wires WGP disposed on the encapsulating layer ECL. Each of the wires WGP may include a base layer BSL and an anti-reflective layer ARL.

The base layer BSL may be disposed on the encapsulating layer ECL. The base layer BSL may include aluminum (Al) or an aluminum alloy (Al alloy). The thickness of the base layer BSL may be 140 nm to 220 nm.

The anti-reflective layer ARL may be disposed on the base layer BSL. The anti-reflective layer ARL may include a material, the refractive index $\eta$ of which ranges from 1.3 to 3.5 and the absorption coefficient $\kappa$ of which ranges from 0.3 to 4.0 within a wavelength range of 250 nm to 550 nm. The thickness of the anti-reflective layer ARL may be 12 nm to 40 nm.

Each of the wires WGP may further include a dielectric layer DIL disposed between the base layer BSL and the anti-reflective layer ARL. The dielectric layer DIL may include a transparent dielectric material, the refractive index fl of which ranges from 1.3 to 2.2 and the absorption coefficient $\kappa$ of which ranges from 0 to 0.5. The thickness of the dielectric layer DIL may be 0 nm to 100 nm.

The polarizing layer Pol may polarize or extinguish incident light L0 that is incident on the polarizing layer Pol depending on the direction in which the incident light L0 vibrates. Here, the incident light L0 may be external light.

The polarizing layer Pol may transmit P-polarized light of the incident light L0. The P-polarized light that has passed through the polarizing layer Pol may be extinguished while resonating between the polarizing layer Pol and the second electrode CE.

Part of S-polarized light may be absorbed in or reflected from the anti-reflective layer ARL, and the remaining part of the S-polarized light may pass through the anti-reflective layer ARL and may be reflected from the base layer BSL. First reflected light L1 reflected from the anti-reflective layer ARL and second reflected light L2 reflected from the base layer BSL may be extinguished by destructive interference. Therefore, the polarizing layer Pol may prevent external light from being reflected from the display panel 100.

The display panel 100 may further include a passivation layer PSL disposed on the polarizing layer Pol. The passivation layer PSL may at least partially cover the polarizing layer Pol and may fill spaces between adjacent wires WGP. Therefore, the passivation layer PSL may planarize the surface of the polarizing layer Pol. The passivation layer PSL may include a material, the refractive index $\eta$ of which ranges from 1 to 1.4.

The above-described polarizing layer may prevent the reflection of light provided from a backlight unit, thus preventing the leakage of light from a display panel. Further, the polarizing layer may prevent the reflection of external light, thus increasing the image quality of the display panel.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A polarizing layer, comprising:
   a substrate; and
   a plurality of parallel wires disposed on the substrate;
   wherein each of the plurality of wires comprises:
   a base layer disposed on the substrate and including aluminum or an aluminum alloy;
   a transparent dielectric layer disposed between the base layer and the substrate; and
   an anti-reflective layer disposed between the dielectric layer and the substrate,
   wherein the anti-reflective layer, the dielectric layer, and the base layer all have equal widths.

2. The polarizing layer of claim 1, wherein the anti-reflective layer comprises tungsten (W), molybdenum (Mo), and/or titanium (Ti).

3. The polarizing layer of claim 1, wherein the plurality of wires includes at least a first wire and a second wire that is adjacent to the first wire, and wherein the anti-reflective layer of the first wire is connected to the anti-reflective layer of the second wire.

4. The polarizing layer of claim 1, wherein the anti-reflective layer has a thickness within a range of 12 nm to 40 nm.

5. The polarizing layer of claim 1, wherein the anti-reflective layer comprises MoTaOx and has a thickness within a range of 45 nm to 100 nm.

6. A polarizing layer, comprising:
   a substrate; and
   a plurality of parallel wires disposed on the substrate;
   wherein each of the plurality of wires comprises:
   a base layer disposed on the substrate and including aluminum or my aluminum alloy; and
   an anti-reflective layer disposed on the base layer and having a thickness within a range of 12 nm to 40 nm,
   wherein the anti-reflective layer comprises tungsten (W), molybdenum (Mo), and/or titanium (Ti),
   wherein the polarizing layer further comprises a dielectric layer disposed between the base layer and the anti-reflective layer, the dielectric layer including a transparent dielectric material, and
   wherein the anti-reflective layer has a refractive index ($\eta$) ranging from 1.3 to 3.5 and has an absorption coefficient ($\kappa$) ranging from 0.3 to 4.0, within a wavelength range of 250 nm to 550 nm.

7. The polarizing layer of claim 6, wherein the dielectric layer has a refractive index ($\eta$) ranging from 1.3 to 2.2 and has an absorption coefficient ($\kappa$) ranging from 0 to 0.5, within a wavelength range of 250 nm to 550 nm.

8. The polarizing layer of claim 7, wherein the dielectric layer comprises silicon nitride, silicon oxide, and/or silicon oxynitride.

9. The polarizing layer of claim 8, wherein the dielectric layer comprises silicon nitride and has a thickness within a range of 45 nm to 70 nm.

10. The polarizing layer of claim 8, wherein: the anti-reflective layer comprises tungsten (W), and the dielectric layer comprises silicon nitride and has a thickness within a range of 20 nm to 70 nm.

11. The polarizing layer of claim 8, wherein: the anti-reflective layer comprises molybdenum (Mo), and the dielectric layer comprises silicon nitride and has a thickness within a range of 40 nm to 85 nm.

12. The polarizing layer of claim 8, wherein: the anti-reflective layer comprises titanium (Ti), and the dielectric layer comprises silicon nitride and has a thickness within a range of 45 nm to 85 nm.

13. The polarizing layer of claim 8, wherein the dielectric layer comprises silicon oxide and has a thickness within a range of 60 nm to 90 nm.

14. The polarizing layer of claim 8, wherein: the anti-reflective layer comprises tungsten (W), and the dielectric layer comprises silicon oxide and has a thickness within a range of 20 nm to 90 nm.

15. The polarizing layer of claim 8, wherein: the anti-reflective layer comprises molybdenum (Mo), and the dielectric layer comprises silicon oxide and has a thickness within a range of 50 nm to 100 nm.

16. The polarizing layer of claim 8, wherein: the anti-reflective layer comprises titanium (Ti), and the dielectric layer comprises silicon oxide and has a thickness within a range of 60 nm to 90 nm.

17. A polarizing layer, comprising:

a substrate; and a plurality of parallel wires disposed on the substrate;

wherein each of the plurality of wires comprises:

a base layer disposed on the substrate and including aluminum or an aluminum alloy; and an anti-reflective layer disposed on the base layer and having a thickness within a range of 12 nm to 40 nm, wherein the polarizing layer further comprises a filling layer filling a cavity formed between the anti-reflective layer and the substrate, wherein the filling layer comprises a material having a refractive index ($\eta$) ranging from 1 to 1.4.

* * * * *